United States Patent
Park et al.

(10) Patent No.: US 12,261,164 B2
(45) Date of Patent: Mar. 25, 2025

(54) SEMICONDUCTOR PACKAGE

(71) Applicant: SAMSUNG ELECTRONICS CO., LTD., Suwon-si (KR)

(72) Inventors: Sang Cheon Park, Hwaseong-si (KR); Dae-Woo Kim, Seongnam-si (KR); Taehun Kim, Anyang-si (KR); Hyuekjae Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/480,310

(22) Filed: Oct. 3, 2023

(65) Prior Publication Data

US 2024/0030214 A1    Jan. 25, 2024

Related U.S. Application Data

(63) Continuation of application No. 17/381,985, filed on Jul. 21, 2021, now Pat. No. 11,798,929.

(30) Foreign Application Priority Data

Nov. 26, 2020  (KR) .................. 10-2020-0161370

(51) Int. Cl.
*H01L 23/495* (2006.01)
*H01L 23/31* (2006.01)
*H01L 23/48* (2006.01)
(Continued)

(52) U.S. Cl.
CPC .......... *H01L 25/18* (2013.01); *H01L 23/3128* (2013.01); *H01L 23/481* (2013.01); *H01L 23/49822* (2013.01); *H01L 23/49827* (2013.01)

(58) Field of Classification Search
CPC ... H01L 25/18; H01L 23/3128; H01L 23/481; H01L 23/49822; H01L 23/49827;
(Continued)

(56) References Cited

U.S. PATENT DOCUMENTS 8,093,704 B2    1/2012  Palmer et al.
9,589,945 B2 *  3/2017  Jo .......................... H01L 23/36
(Continued)

OTHER PUBLICATIONS

Office Action issued in parent U.S. Appl. No. 17/381,985 mailed Mar. 22, 2023.
(Continued)

*Primary Examiner* — Niki H Nguyen
(74) *Attorney, Agent, or Firm* — Sughrue Mion, PLLC

(57) ABSTRACT

A semiconductor package includes a redistribution substrate, a first memory chip provided on the redistribution substrate, the first memory chip comprising a first base layer, a first circuit layer provided on a top surface of the first base layer, and a first via penetrating the first base layer and connected to the first circuit layer and the redistribution substrate, a logic chip provided on the first memory chip, and a first molding layer surrounding the first memory chip. An outer side surface of the first molding layer is coplanar with a side surface of the logic chip. At an interface of the logic chip and the first memory chip, a first chip pad provided in the first circuit layer of the first memory chip and a second chip pad of the logic chip are formed of the same material and constitute one body.

20 Claims, 27 Drawing Sheets

(51) Int. Cl.
*H01L 23/498* (2006.01)
*H01L 25/18* (2023.01)

(58) Field of Classification Search
CPC .............. H01L 25/0657; H01L 25/50; H01L 2924/00014; H01L 2225/06541; H01L 2924/15311; H01L 2224/16225; H01L 2224/16145; H01L 2924/00; H01L 2924/012; H01L 25/0652; H01L 2224/0401; H01L 2224/17181; H01L 25/105; H01L 2224/16227; H01L 2224/73204; H01L 24/08; H01L 24/20; H01L 24/13; H01L 24/19; H01L 2224/04105; H01L 2225/06565; H01L 2225/06548; H01L 2224/16146; H01L 24/05; H01L 2924/1431; H01L 2225/06589; H01L 2224/48091; H01L 2224/48227; H01L 2224/12105; H01L 2224/08145; H01L 2924/181; H01L 2224/73265; H01L 23/49816; H01L 27/0688

See application file for complete search history.

(56) References Cited

U.S. PATENT DOCUMENTS

| | | | |
|---|---|---|---|
| 9,666,520 | B2 | 5/2017 | Yu et al. |
| 10,026,724 | B2 * | 7/2018 | Kim .................... H01L 21/6835 |
| 10,128,213 | B2 | 11/2018 | Yu et al. |
| 10,515,940 | B2 | 12/2019 | Yu et al. |
| 10,727,217 | B2 | 7/2020 | Chen et al. |
| 2017/0062383 | A1 | 3/2017 | Yee et al. |
| 2018/0006006 | A1 | 1/2018 | Kim et al. |
| 2020/0043896 | A1 | 2/2020 | Yu et al. |
| 2021/0050300 | A1 | 2/2021 | Lin et al. |
| 2022/0068829 | A1 | 3/2022 | Park et al. |
| 2022/0077116 | A1 | 3/2022 | Park et al. |

OTHER PUBLICATIONS

Notice of Allowance issued in parent U.S. Appl. No. 17/381,985 mailed Jun. 15, 2023.

* cited by examiner

SEMICONDUCTOR PACKAGE

CROSS-REFERENCE TO THE RELATED APPLICATION

This application is a continuation of U.S. application Ser. No. 17/381,985 filed on Jul. 21, 2021, which claims priority under 35 U.S.C. § 119 to Korean Patent Application No. 10-2020-0161370, filed on Nov. 26, 2020, in the Korean Intellectual Property Office, the disclosures of which are incorporated by reference herein in their entirety.

BACKGROUND

The disclosure relates to a semiconductor package and, more particularly, to a stack-type semiconductor package.

High-performance, high-speed and small electronic components have been increasingly demanded with advancements in the electronics industry. To satisfy these demands, a packaging technique of providing a plurality of semiconductor chips in a single package has been suggested.

Recently, portable devices have been increasingly demanded in the electronics market, and thus small and light electronic components mounted in the electronics have been required. A semiconductor package technique of integrating a plurality of individual components in a single package as well as a technique of reducing a size of an individual component may be required to realize small and light electronic components. In particular, a semiconductor package of processing a high-frequency signal may be required to have excellent electrical characteristics as well as a small size.

SUMMARY

One or more example embodiments may provide a semiconductor package capable of improving structural stability and electrical characteristics.

One or more example embodiments may also provide a small semiconductor package.

One or more example embodiments may also provide a semiconductor package capable of easily dissipating heat.

According to an aspect of example embodiment, a semiconductor package includes a redistribution substrate; a first memory chip provided on the redistribution substrate, the first memory chip including a first base layer; a first circuit layer provided on a top surface of the first base layer; and a first via penetrating the first base layer and connected to the first circuit layer and the redistribution substrate; a logic chip provided on the first memory chip; and a first molding layer surrounding the first memory chip, wherein an outer side surface of the first molding layer is coplanar with a side surface of the logic chip, and wherein, at an interface between the logic chip and the first memory chip, a first chip pad provided in the first circuit layer of the first memory chip and a second chip pad provided in the logic chip are formed of a same first material and constitute a single body.

According to an aspect of example embodiment, a semiconductor package includes a redistribution substrate; a first memory chip provided on the redistribution substrate, wherein a top surface of the first memory chip comprises an active surface; a logic chip provided on the first memory chip, wherein a bottom surface of the first memory chip includes an active surface; a first molding layer surrounding the logic chip and provided on the first memory chip; a connection terminal provided under the redistribution substrate; a first via vertically penetrating the first memory chip, wherein a width of the logic chip is less than a width of the first memory chip, wherein, at an interface of the logic chip and the first memory chip, a first chip pad provided at the first active surface of the first memory chip and a second chip pad provided at the second active surface of the logic chip constitute a single body formed of a same material, wherein the redistribution substrate includes: an insulating layer; an interconnection pattern horizontally extending in the insulating layer; and a via pattern vertically penetrating the insulating layer and connected to the interconnection pattern, and wherein the first via is connected to the via pattern of the redistribution substrate.

According to an aspect of example embodiment, a semiconductor package includes an interposer substrate; a first chip stack provided on the interposer substrate; and a second chip stack provided on the interposer substrate, the second chip stack being horizontally spaced apart from the first chip stack and including a plurality of semiconductor chips vertically stacked, wherein the first chip stack includes a redistribution substrate mounted on the interposer substrate by using a connection terminal; a first semiconductor chip disposed on the redistribution substrate, the first semiconductor chip including a first base layer and a first circuit layer on the first base layer; a second semiconductor chip mounted on the first semiconductor chip, the second semiconductor chip including a second base layer and a second circuit layer disposed under the second base layer and contacting the first circuit layer; and a molding layer surrounding the first semiconductor chip on the redistribution substrate, wherein a first circuit pattern of the first circuit layer and a second circuit pattern of the second circuit layer are formed of a same material and constitute a single body, and wherein a width of the first semiconductor chip is less than a width of the second semiconductor chip.

BRIEF DESCRIPTION OF THE DRAWINGS

The above and other aspects, features, and advantages of certain example embodiments will become more apparent from the following description taken in conjunction with the accompanying drawings, in which.

DETAILED DESCRIPTION OF EMBODIMENTS

Semiconductor packages according to example embodiments will be described hereinafter with reference to the accompanying drawings.

Figure 1:
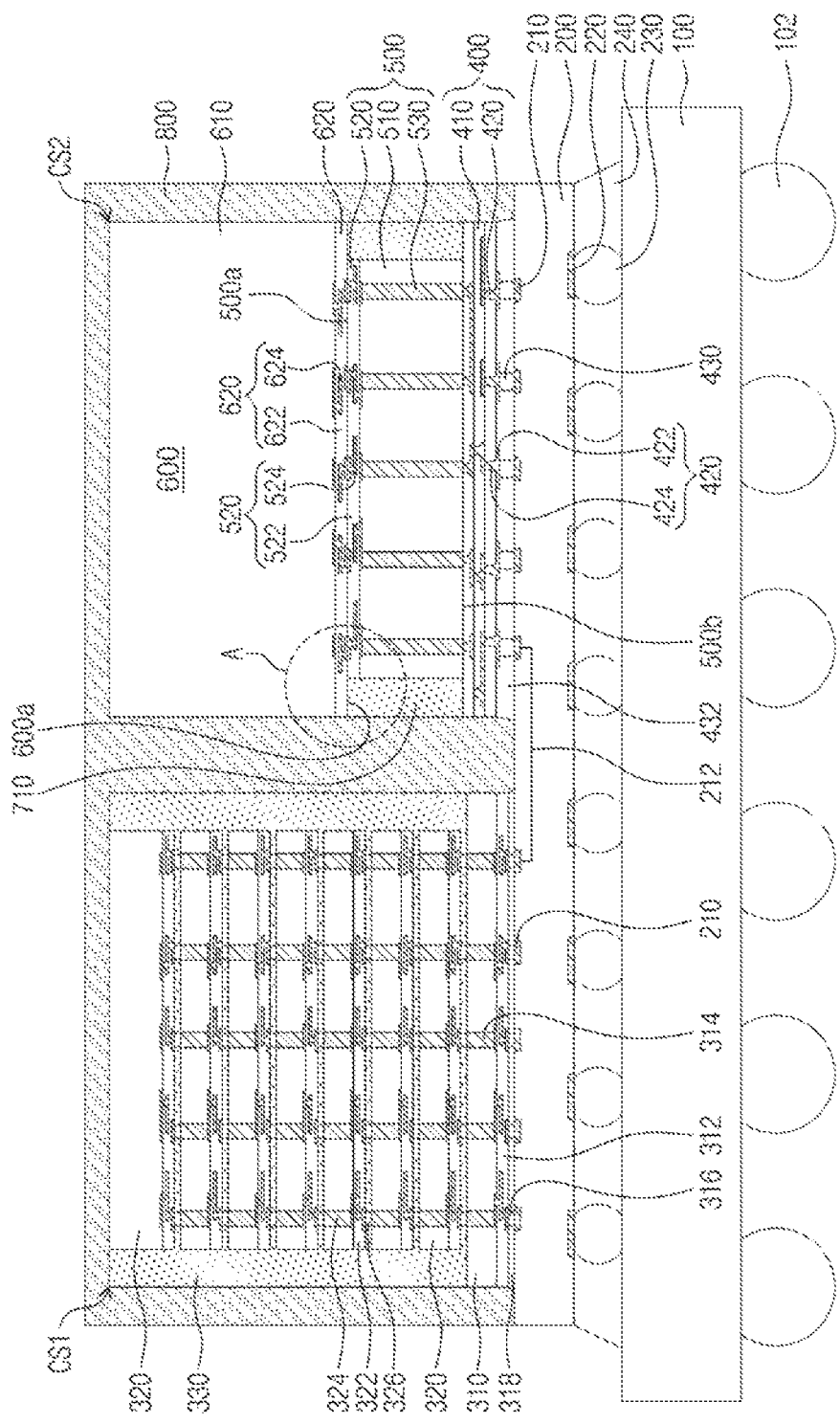
FIG. 1 is a cross-sectional view illustrating a semiconductor package according to some embodiments.
Figure 2:
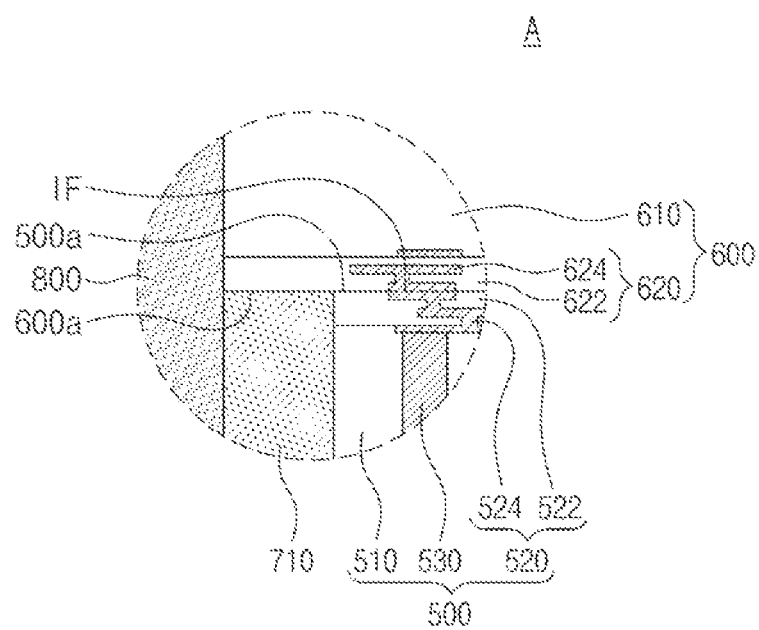
FIG. 2 is an enlarged view of a region 'A' of FIG. 1.
Figure 3:
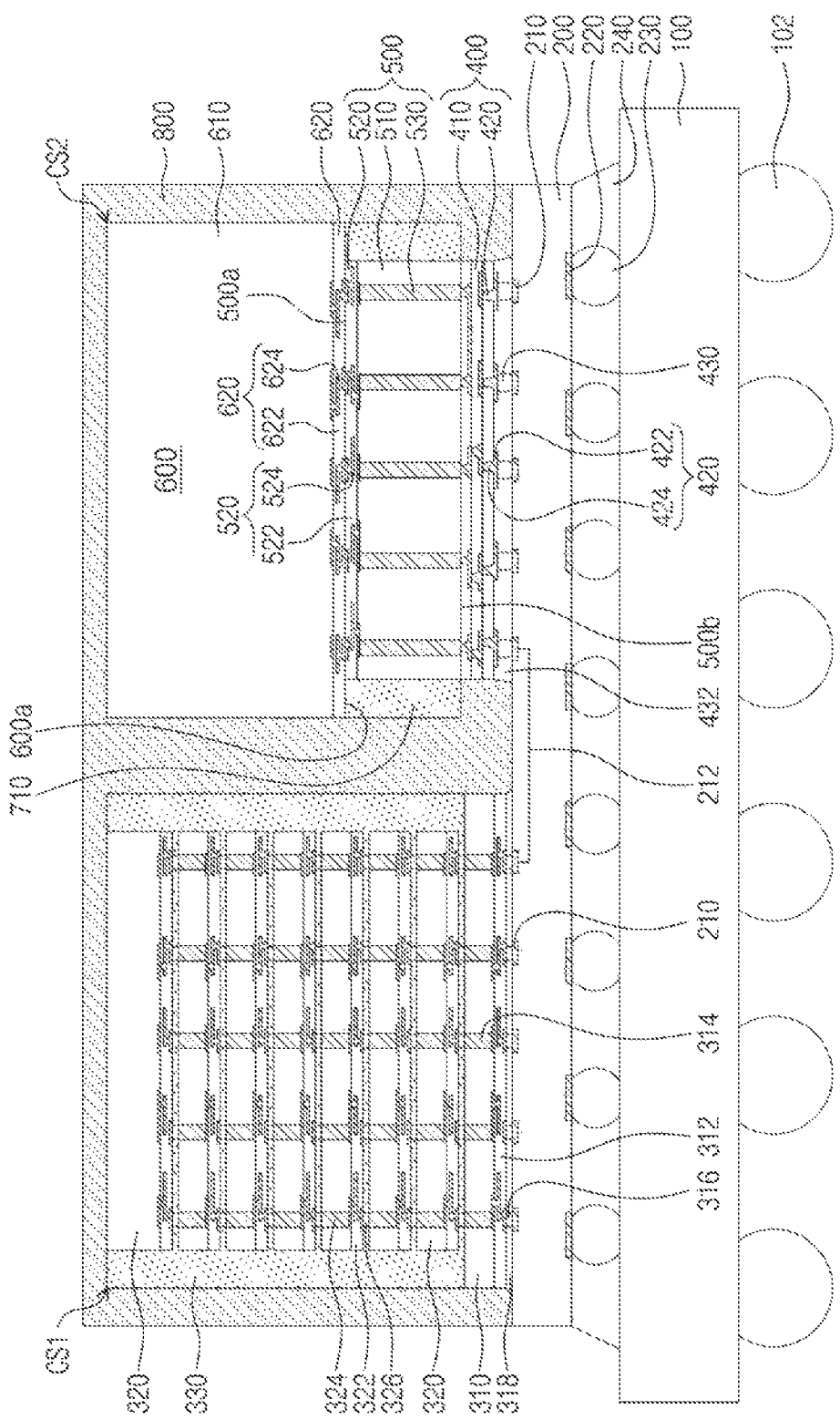
FIGS. 3 to 5 are cross-sectional views illustrating semiconductor packages according to some embodiments.
Figure 4:
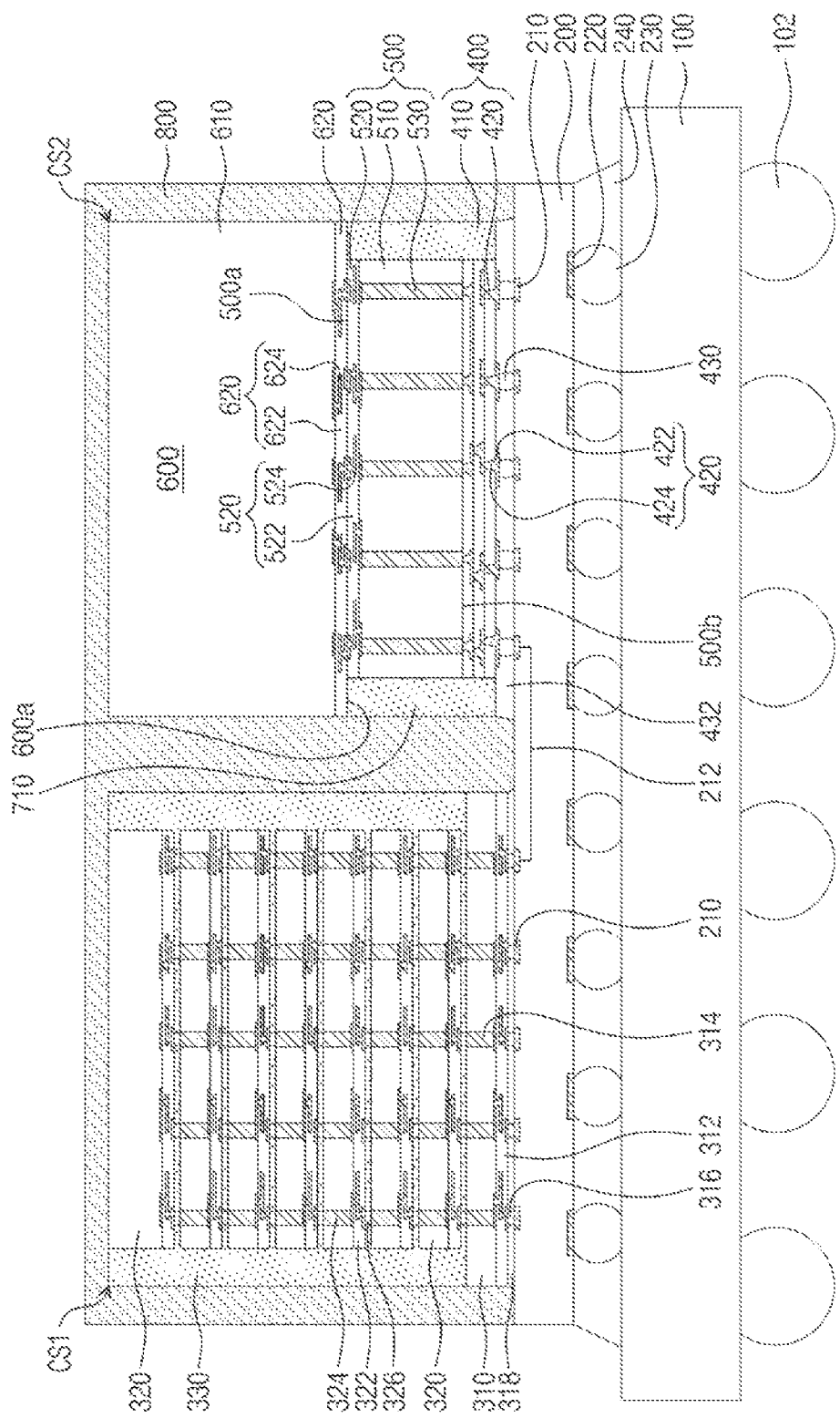

FIG. 1 is a cross-sectional view illustrating a semiconductor package according to some example embodiments. FIG. 2 is an enlarged view of a region 'A' of FIG. 1. FIGS. 3 and 4 are cross-sectional views illustrating semiconductor packages according to some example embodiments.

Referring to FIGS. 1 and 2, a package substrate 100 may be provided. The package substrate 100 may include a printed circuit board (PCB) having signal patterns on its top surface. Alternatively, the package substrate 100 may have a structure in which insulating layers and interconnection layers are alternately stacked. The package substrate 100 may have pads disposed on its top surface.

External terminals 102 may be disposed under the package substrate 100. For example, the external terminals 102 may be disposed on terminal pads disposed on a bottom surface of the package substrate 100. The external terminals 102 may include solder balls or solder bumps. The semiconductor package may be provided in the form of a ball grid array (BGA), a fine ball-grid array (FBGA) or a land grid array (LGA), depending on a kind and arrangement of the external terminals 102.

An interposer substrate 200 may be provided on the package substrate 100. The interposer substrate 200 may be mounted on the top surface of the package substrate 100. The interposer substrate 200 may include first substrate pads 210 exposed at a top surface of the interposer substrate 200, and second substrate pads 220 exposed at a bottom surface of the interposer substrate 200. Here, top surfaces of the first substrate pads 210 may be coplanar with the top surface of the interposer substrate 200. The interposer substrate 200 may redistribute a first chip stack CS1 and a second chip stack CS2, which will be described later. For example, the first substrate pads 210 and the second substrate pads 220 may be electrically connected to each other through circuit interconnection lines in the interposer substrate 200 and may constitute a redistribution circuit along with the circuit interconnection lines. The first substrate pads 210 and the second substrate pads 220 may include a conductive material such as a metal. For example, the first substrate pads 210 and the second substrate pads 220 may include copper (Cu). The interposer substrate 200 may be formed of an insulating material or silicon (Si). When the interposer substrate 200 includes silicon (Si), the interposer substrate 200 may be a silicon interposer substrate having a through-electrode vertically penetrating the silicon interposer substrate.

Substrate terminals 230 may be disposed on the bottom surface of the interposer substrate 200. The substrate terminals 230 may be provided between the pads of the package substrate 100 and the second substrate pads 220 of the interposer substrate 200. The substrate terminals 230 may electrically connect the interposer substrate 200 to the package substrate 100. For example, the interposer substrate 200 may be mounted on the package substrate 100 by a flip chip method. The substrate terminals 230 may include solder balls or solder bumps.

A first underfill layer 240 may be provided between the package substrate 100 and the interposer substrate 200. The first underfill layer 240 may fill a space between the package substrate 100 and the interposer substrate 200 and may surround the substrate terminals 230.

A first chip stack CS1 may be disposed on the interposer substrate 200. The first chip stack CS1 may include a plurality of memory chips and may provide a memory of the semiconductor package. For example, the first chip stack CS1 may include a base substrate, first semiconductor chips 320 corresponding to memory chips stacked on the base substrate, and a first molding layer 330 surrounding the first semiconductor chips 320. Hereinafter, the components of the first chip stack CS1 will be described in detail.

The base substrate may be a base semiconductor chip 310. For example, the base substrate may be a wafer-level semiconductor substrate formed of a semiconductor material such as silicon. Hereinafter, the base semiconductor chip 310 and the base substrate may refer to the same component, and the base semiconductor chip and the base substrate may be indicated by the same reference numeral. A thickness of the base semiconductor chip 310 may range from 40 μm to 100 μm.

The base semiconductor chip 310 may include a base circuit layer 312 and a base through-electrode 314. The base circuit layer 312 may be provided on a bottom surface of the base semiconductor chip 310. The base circuit layer 312 may include an integrated circuit. For example, the base circuit layer 312 may include a memory circuit. In other words, the base semiconductor chip 310 may be a memory chip such as a dynamic random-access memory (DRAM) chip, a static random-access memory (SRAM) chip, a magnetoresistive random-access memory (MRAM) chip, or a flash memory chip. The base through-electrode 314 may penetrate the base semiconductor chip 310 in a direction perpendicular to the top surface of the interposer substrate 200. The base through-electrode 314 and the base circuit layer 312 may be electrically connected to each other. The bottom surface of the base semiconductor chip 310 may be an active surface. The base substrate includes the base semiconductor chip 310 in FIG. 1. However, embodiments of the disclosure are not limited thereto. In certain embodiments, the base substrate may not include the base semiconductor chip 310.

The base semiconductor chip 310 may further include a protective layer and first connection terminals 316. The protective layer may be disposed on the bottom surface of the base semiconductor chip 310 to cover the base circuit layer 312. The protective layer may include silicon nitride (SiN). The first connection terminals 316 may be provided on the bottom surface of the base semiconductor chip 310. The first connection terminals 316 may be electrically connected to the base circuit layer 312. The first connection terminals 316 may be exposed from the protective layer.

A first semiconductor chip 320 may be mounted on the base semiconductor chip 310. A thickness of the first semiconductor chip 320 may range from 40 μm to 100 μm. A width of the first semiconductor chip 320 may be less than a width of the base semiconductor chip 310.

The first semiconductor chip 320 may include a circuit layer 322 and a through-electrode 324. The circuit layer 322 may include a memory circuit. In other words, the first semiconductor chip 320 may be a memory chip such as a DRAM chip, a SRAM chip, a MRAM chip, or a flash memory chip. The circuit layer 322 may include the same circuit as the base circuit layer 312. However, embodiments of the disclosure are not limited thereto. The through-electrode 324 may penetrate the first semiconductor chip 320 in the direction perpendicular to the top surface of the interposer substrate 200. The through-electrode 324 may be electrically connected to the circuit layer 322. A bottom surface of the first semiconductor chip 320 may be an active surface. First bumps 326 may be provided on the bottom surface of the first semiconductor chip 320. The first bumps 326 may be provided between the base semiconductor chip 310 and the first semiconductor chip 320 to electrically connect the base semiconductor chip 310 and the first semiconductor chip 320 to each other.

The first semiconductor chip 320 may be provided in plurality. For example, the plurality of first semiconductor chips 320 may be stacked on the base semiconductor chip 310. The number of the stacked first semiconductor chips 320 may range from 8 to 32. In this case, the first bumps 326 may also be formed between the stacked semiconductor chips 320. Here, an uppermost one of the first semiconductor chips 320 may not include the through-electrode 324. In addition, a thickness of the uppermost first semiconductor chip 320 may be greater than thicknesses of the first semiconductor chips 320 disposed thereunder.

An adhesive layer may be provided between the semiconductor chips 320. The adhesive layer may include a non-conductive film (NCF). The adhesive layer may be disposed between the first bumps 326 provided between the first semiconductor chips 320 to prevent occurrence of an electrical short between the first bumps 326.

The first molding layer 330 may be disposed on the top surface of the base semiconductor chip 310. The first molding layer 330 may at least partially cover the base semiconductor chip 310 and may surround the first semiconductor chips 320. A top surface of the first molding layer 330 may be coplanar with a top surface of the uppermost first semiconductor chip 320, and the uppermost first semiconductor chip 320 may be exposed from the first molding layer 330. The first molding layer 330 may include an insulating polymer material. For example, the first molding layer 330 may include an epoxy molding compound (EMC).

The first chip stack CS1 may be provided as described above. The first chip stack CS1 may be mounted on the interposer substrate 200. For example, the first chip stack CS1 may be connected to the first substrate pads 210 of the interposer substrate 200 through the first connection terminals 316 of the base semiconductor chip 310.

A second underfill layer 318 may be provided between the interposer substrate 200 and the first chip stack CS1. The second underfill layer 318 may fill a space between the interposer substrate 200 and the base semiconductor chip 310 and may surround the first connection terminals 316.

A second chip stack CS2 may be disposed on the interposer substrate 200. The second chip stack CS2 may include a logic chip and at least one memory chip and may be a chip stack for driving the semiconductor package. For example, the second chip stack CS2 may include a redistribution substrate 400, a second semiconductor chip 500 (e.g., a memory chip) disposed on the redistribution substrate 400, and a third semiconductor chip 600 (e.g., a logic chip) disposed on the second semiconductor chip 500. For example, as illustrated in FIG. 1, the second chip stack CS2 including the second semiconductor chip 500 corresponding to a single memory chip will be described. Hereinafter, the components of the second chip stack CS2 will be described in detail.

The redistribution substrate 400 may include a plurality of redistribution layers sequentially stacked.

Each of the redistribution layers may include an insulating pattern 410 and a conductive pattern 420 provided in the insulating pattern 410. The conductive pattern 420 of one redistribution layer may be electrically connected to the conductive pattern 420 of another redistribution layer adjacent thereto. Hereinafter, the components of one redistribution layer will be described.

The insulating pattern 410 may include an insulating polymer or a photo-imageable dielectric (PID). For example, the photo-imageable dielectric (PID) may include at least one of photosensitive polyimide, polybenzoxazole (PBO), a phenol-based polymer, or a benzocyclobutene-based polymer. The insulating pattern 410 may have a single-layered structure or a multi-layered structure. When the insulating pattern 410 has the multi-layered structure, layers of the insulating pattern 410 may be formed of the same material or may be formed of different materials.

The conductive pattern 420 may be provided in the insulating pattern 410. The conductive pattern 420 may have a damascene structure. The conductive pattern 420 may have an inverted T-shaped cross section. For example, the conductive pattern 420 may have a head portion 422 and a tail portion 424, which are integrally connected to each other (i.e., may constitute a single body). The head portion 422 may correspond to an interconnection pattern horizontally redistributing electrical connection of the second semiconductor chip 500 to be described later, and the tail portion 424 may correspond to a via pattern vertically connecting the conductive patterns 420 of the redistribution layers. The head portion 422 and the tail portion 424 may vertically overlap with each other, and the tail portion 424 may extend from the head portion 422 toward a top surface of the insulating pattern 410. An interface may not exist between the head portion 422 and the tail portion 424. A bottom surface of the conductive pattern 420 may be disposed at the same level as a bottom surface of the corresponding insulating pattern 410. The head portion 422 of the conductive pattern 420 of a lowermost redistribution layer may be exposed at a bottom surface of the redistribution substrate 400. The head portion 422 of the conductive pattern 420 of the lowermost redistribution layer may be a pad to which a second connection terminal 430 to be described later is connected. The tail portion 424 of the conductive pattern 420 of an uppermost redistribution layer may be exposed at a top surface of the redistribution substrate 400. The tail portion 424 of the conductive pattern 420 of the uppermost redistribution layer may be a portion on which the second semiconductor chip 500 is mounted. A top surface of the tail portion 424 may be disposed at the same level as a top surface of the corresponding insulating pattern 410. The conductive pattern 420 may include a conductive material. For example, the conductive pattern 420 may include copper (Cu).

A barrier layer may be disposed between the insulating pattern 410 and the conductive pattern 420. The barrier layer may surround the head portion 422 and the tail portion 424 of the conductive pattern 420. A gap between the conductive pattern 420 and the insulating pattern 410 (i.e., a thickness of the barrier layer) may range from 50 Å to 1000 Å. The barrier layer may include titanium (Ti), tantalum (Ta), titanium nitride (TiN), and/or tantalum nitride (TaN).

Second connection terminals 430 may be provided under the redistribution substrate 400. Each of the second connection terminals 430 may be connected to a conductive pattern 420 of the lowermost redistribution layer. The second connection terminals 430 may include solder balls or solder bumps.

The second semiconductor chip 500 may be disposed on the redistribution substrate 400. The second semiconductor chip 500 may be disposed face-up on the redistribution substrate 400. In other words, the top surface of the second semiconductor chip 500 may include an active surface.

The second semiconductor chip 500 may be disposed on the top surface of the redistribution substrate 400. The second semiconductor chip 500 may be a memory chip such as a DRAM chip, an SRAM chip, an MRAM chip, or a flash memory chip. The second semiconductor chip 500 may have a front surface 500a and a back surface 500b. For example, the front surface may be a surface adjacent to an active surface of an integrated device in a semiconductor chip and may be defined as a surface on which pads of the semiconductor chip are formed. The back surface may be defined as another surface opposite to the front surface. The back surface 500b of the second semiconductor chip 500 may face the redistribution substrate 400. A width of the second semiconductor chip 500 may be less than a width of the redistribution substrate 400. The second semiconductor chip 500 may include a first base layer 510, a first circuit layer 520 provided on one surface of the first base layer 510, and at least one first via 530 penetrating the first base layer 510.

The first base layer 510 may include silicon (Si). An integrated device or integrated circuits may be formed in an upper portion of the first base layer 510. The integrated device or integrated circuits may include a memory circuit.

The first circuit layer 520 may be provided on a top surface of the first base layer 510. The first circuit layer 520 may be electrically connected to the integrated device or integrated circuits formed in the first base layer 510. For example, the first circuit layer 520 may include a first circuit pattern 524 provided in a first insulating pattern 522, and the first circuit pattern 524 may be connected to the integrated device or integrated circuits formed in the first base layer 510. A portion of the first circuit pattern 524 may be exposed at a top surface of the first circuit layer 520, and the exposed portion of the first circuit pattern 524 may correspond to a pad of the second semiconductor chip 500. A top surface (i.e., the front surface) 500a of the second semiconductor chip 500, at which the first circuit layer 520 is provided, may be an active surface of the second semiconductor chip 500.

The first via 530 may vertically penetrate the first base layer 510. One end of the first via 530 may be exposed at a bottom surface of the first base layer 510. A bottom surface of the first via 530 may be coplanar with the bottom surface of the first base layer 510 (i.e., the back surface 500b of the second semiconductor chip 500). The bottom surface of the first via 530 and the bottom surface of the first base layer 510 may be substantially flat. Another end of the first via 530 may extend toward the front surface 500a of the second semiconductor chip 500 so as to be connected to the first circuit layer 520. The first via 530 may be connected to the first circuit pattern 524 of the first circuit layer 520.

A passivation layer may be provided on the bottom surface of the first base layer 510. The passivation layer may cover the bottom surface of the first base layer 510, and the first via 530 may penetrate the passivation layer so as to be exposed at a bottom surface of the passivation layer. The passivation layer may include an insulating material. For example, the passivation layer may include silicon nitride (SiN), silicon oxide (SiO), or silicon oxynitride (SiON).

The second semiconductor chip 500 may be mounted on the redistribution substrate 400. For example, the first base layer 510 of the second semiconductor chip 500 may be in contact with the top surface of the redistribution substrate 400. Here, the first via 530 of the second semiconductor chip 500 may be connected to the tail portion 424 of the conductive pattern 420 of the uppermost layer of the redistribution substrate 410.

A second molding layer 710 may be disposed on the top surface of the redistribution substrate 400. The second molding layer 710 may at least partially cover the top surface of the redistribution substrate 400. The second molding layer 710 may be disposed adjacent to a side surface of the second semiconductor chip 500. In detail, the second molding layer 710 may be disposed adjacent to both side surfaces of the second semiconductor chip 500. For example, the second molding layer 710 may surround the second semiconductor chip 500 in a plan view. The second molding layer 710 may cover the side surfaces of the second semiconductor chip 500. The second molding layer 710 may protect the second semiconductor chip 500. Here, the second molding layer 710 may not cover or contact the front surface 500a of the second semiconductor chip 500. In other words, the second molding layer 710 may expose the front surface 500a of the second semiconductor chip 500. A top surface of the second molding layer 710 may be coplanar with the front surface 500a of the second semiconductor chip 500, and the top surface of the second molding layer 710 and the front surface 500a of the second semiconductor chip 500 may be substantially flat. The side surface of the second molding layer 710 may be vertically aligned with a side surface of the redistribution substrate 400. For example, the side surface of the second molding layer 710 and the side surface of the redistribution substrate 400 may be located in the same plane. The second molding layer 710 may include an insulating material. For example, the second molding layer 710 may include an insulating material having high machinability, such as polyimide.

Unlike FIG. 1, a width 502 of the second semiconductor chip 500 may be equal to a width 402 of the redistribution substrate 400, and the side surface of the second semiconductor chip 500 may be vertically aligned with the side surface of the redistribution substrate 400. As illustrated in FIG. 3, the second molding layer 710 may surround the second semiconductor chip 500. The second molding layer 710 may be in contact with a bottom surface 600a of the third semiconductor chip 600 to be described later. A bottom surface of the second molding layer 710 may be located at the same level as the bottom surface of the second semiconductor chip 500. Thus, the side surface of the redistribution substrate 400 may be exposed. In other words, the second molding layer 710 may not cover or contact the side surface of the redistribution substrate 400. Alternatively, as illustrated in FIG. 4, the second molding layer 710 may extend onto the side surface of the redistribution substrate 400. Thus, the second molding layer 710 may protect the second semiconductor chip 500 and the redistribution substrate 400. In this case, the bottom surface of the second molding layer 710 may be located at the same level as the bottom surface of the redistribution substrate 400.

Referring again to FIGS. 1 and 2, the third semiconductor chip 600 may be disposed on the second semiconductor chip 500. The third semiconductor chip 600 may be disposed face-down on the second semiconductor chip 500. In other words, the bottom surface of the third semiconductor chip 600 may include an active surface. The third semiconductor chip 600 may be a logic chip. The third semiconductor chip 600 may have a front surface 600a and a back surface. The front surface 600a of the third semiconductor chip 600 may face the second semiconductor chip 500. A width of the third semiconductor chip 600 may be equal to the width of the redistribution substrate 400. A side surface of the third semiconductor chip 600 may be vertically aligned with the side surface of the redistribution substrate 400 and an outer side surface of the second molding layer 710. For example, the side surface of the second semiconductor chip 500 may have a shape recessed from the side surface of the third semiconductor chip 600 and the side surface of the redistribution substrate 400. The second molding layer 710 may be in contact with the front surface 600a of the third semiconductor chip 600 and the top surface of the redistribution substrate 400. The third semiconductor chip 600 may include a second base layer 610 and a second circuit layer 620 provided on one surface of the second base layer 610.

The second base layer 610 may include silicon (Si). An integrated device or integrated circuits may be formed in a lower portion of the second base layer 610. The integrated device or integrated circuits may include a logic circuit.

The second circuit layer 620 may be provided on a bottom surface of the second base layer 610. The second circuit layer 620 may be electrically connected to the integrated device or integrated circuits formed in the second base layer 610. For example, the second circuit layer 620 may include a second circuit pattern 624 provided in a second insulating pattern 622, and the second circuit pattern 624 may be connected to the integrated device or integrated circuits formed in the second base layer 610. A portion of the second circuit pattern 624 may be exposed at a bottom surface of the second circuit layer 620, and the exposed portion of the second circuit pattern 624 may correspond to a pad of the third semiconductor chip 600. The bottom surface (i.e., the front surface) 600a of the third semiconductor chip 600, at which the second circuit layer 620 is provided, may be an active surface of the third semiconductor chip 600.

The third semiconductor chip 600 may form a chip-on-wafer (COW) structure with the second semiconductor chip 500. The width of the second semiconductor chip 500 may be less than the width of the third semiconductor chip 600. For example, the width of the second semiconductor chip 500 may be greater than 60% of the width of the third semiconductor chip 600 and less than 100% of the width of the third semiconductor chip 600. The second semiconductor chip 500 may be in direct contact with the third semiconductor chip 600. In other words, a top surface of the first circuit layer 520 of the second semiconductor chip 500 may be in contact with a bottom surface of the second circuit layer 620 of the third semiconductor chip 600 at a boundary of the second semiconductor chip 500 and the third semiconductor chip 600. The first circuit layer 520 may be hybrid-bonded to the second circuit layer 620. For example, the hybrid bonding may mean that two components including the same kind of a material are fused together at their interface. For example, the first circuit pattern 524 of the first circuit layer 520 and the second circuit pattern 624 of the second circuit layer 620 may constitute a continuous component, and an interface IF between the first and second circuit patterns 524 and 624 may not be visible. For example, the first and second circuit patterns 524 and 624 which are in contact with each other at a boundary of the first and second insulating patterns 522 and 622 may be formed of the same material, and thus the interface IF of the first and second circuit patterns 524 and 624 may not exist. In other words, the first and second circuit patterns 524 and 624 may be provided as a single component. Thus, the first circuit pattern 524 and the second circuit pattern 624 may constitute the continuous component. The second semiconductor chip 500 and the third semiconductor chip 600 may be electrically connected to each other through the first circuit pattern 524 and the second circuit pattern 624.

According to the embodiments of the disclosure, the first circuit pattern 524 and the second circuit pattern 624 may be formed in one body, and thus the second and third semiconductor chips 500 and 600 may be firmly bonded to each other. As a result, electrical characteristics and structural stability of the semiconductor package may be improved.

Since the second and third semiconductor chips 500 and 600 are bonded directly to each other, an additional connection terminal between the second and third semiconductor chips 500 and 600 and a protective material for protecting the additional connection terminal may not be required. Thus, a height of the second chip stack CS2 may be reduced to provide a small semiconductor package. In addition, heat generated from the second and third semiconductor chips 500 and 600 may be easily released or dissipated by way of the third semiconductor chip 600. Furthermore, the second molding layer 710 may expose (i.e., may not cover or contact) the side surface of the third semiconductor chip 600. Thus, heat generated from the third semiconductor chip 600 which may generate a lot of heat may be easily released or dissipated.

The second chip stack CS2 may be provided as described above. The second chip stack CS2 may be mounted on the interposer substrate 200. For example, the second chip stack CS2 may be connected to the first substrate pads 210 of the interposer substrate 200 through the second connection terminals 430 of the redistribution substrate 400. A top surface of the second chip stack CS2 (i.e., a top surface of the third semiconductor chip 600) may be disposed at the same level as a top surface of the first chip stack CS1.

A third underfill layer 432 may be provided between the interposer substrate 200 and the second chip stack CS2. The third underfill layer 432 may fill a space between the interposer substrate 200 and the redistribution substrate 400 and may surround the second connection terminals 430.

The first chip stack CS1 and the second chip stack CS2 may be electrically connected to each other through a circuit interconnection line 212 provided in the interposer substrate 200.

A third molding layer 800 may be provided on the interposer substrate 200. The third molding layer 800 may cover the top surface of the interposer substrate 200. The third molding layer 800 may surround the first chip stack CS1 and the second chip stack CS2. The third molding layer 800 may include an insulating material. For example, the third molding layer 800 may include an epoxy molding compound (EMC). In FIG. 1, the third molding layer 800 covers the first chip stack CS1 and the second chip stack CS2. Alternatively, the top surface of the first chip stack CS1 and the top surface of the second chip stack CS2 may be exposed from the third molding layer 800.

The semiconductor package may be provided as described above.

Figure 5:
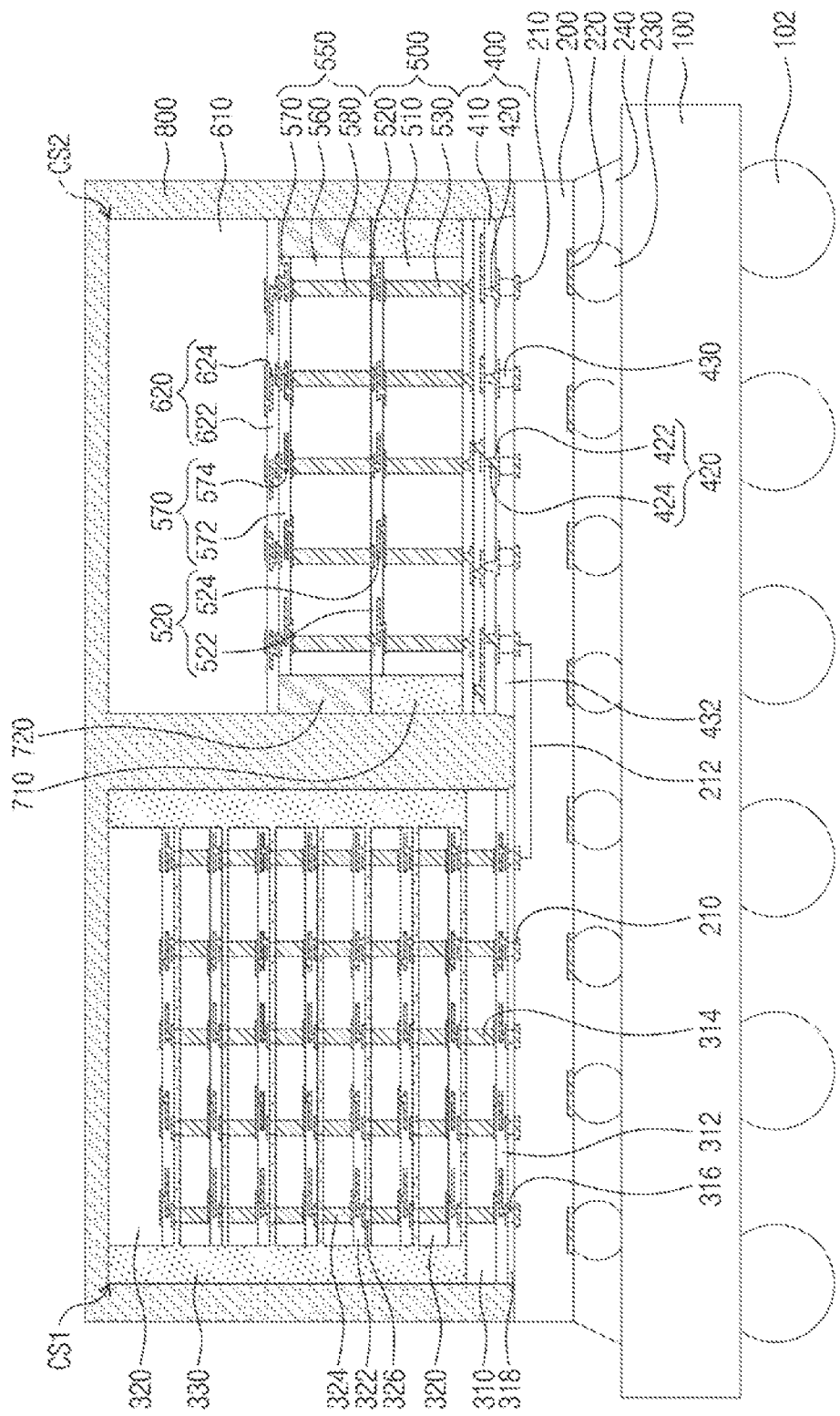

FIG. 5 is a cross-sectional view illustrating a semiconductor package according to some example embodiments. In the following example embodiments, the same components as in the example embodiments of FIGS. 1 to 4 will be indicated by the same reference numerals or designators, and the descriptions thereto will be omitted or mentioned briefly for the purpose of ease and convenience in explanation. In other words, differences between the following embodiments and the embodiments of FIGS. 1 to 4 will be mainly described.

Referring to FIG. 5, the second chip stack CS2 may include a plurality of memory chips. For example, a fourth semiconductor chip 550 may further be provided between the second semiconductor chip 500 and the third semiconductor chip 600.

The fourth semiconductor chip 550 may be disposed on the top surface of the second semiconductor chip 500. The fourth semiconductor chip 550 may include substantially the same semiconductor chip as the second semiconductor chip 500. The fourth semiconductor chip 550 may be a memory chip such as a DRAM chip, a SRAM chip, a MRAM chip, or a flash memory chip. The fourth semiconductor chip 550 may have a front surface and a back surface. The back surface of the fourth semiconductor chip 550 may face the second semiconductor chip 500. A width of the fourth semiconductor chip 550 may be equal to the width of the second semiconductor chip 500. A side surface of the fourth semiconductor chip 550 may be vertically aligned with the side surface of the second semiconductor chip 500. The fourth semiconductor chip 550 may include a third base layer 560, a third circuit layer 570 provided on one surface of the third base layer 560, and at least one third via 580 penetrating the third base layer 560.

The third base layer 560 may include silicon (Si). An integrated device or integrated circuits may be formed in an upper portion of the third base layer 560. The integrated device or integrated circuits may include a memory circuit.

The third circuit layer 570 may be provided on a top surface of the third base layer 560. The third circuit layer 570 may be electrically connected to the integrated device or integrated circuits formed in the third base layer 560. For example, the third circuit layer 570 may include a third circuit pattern 574 provided in a third insulating pattern 572, and the third circuit pattern 574 may be connected to the integrated device or integrated circuits formed in the third base layer 560. A portion of the third circuit pattern 574 may be exposed at a top surface of the third circuit layer 570, and the exposed portion of the third circuit pattern 574 may correspond to a pad of the fourth semiconductor chip 550. A top surface (i.e., the front surface) of the fourth semiconductor chip 550, at which the third circuit layer 570 is provided, may be an active surface of the fourth semiconductor chip 550.

A third via of the at least one third via 580 may vertically penetrate the third base layer 560. One end of the third via 580 may be exposed at a bottom surface of the third base layer 560. A bottom surface of the third via 580 may be coplanar with the bottom surface of the third base layer 560 (i.e., the back surface of the fourth semiconductor chip 550). The bottom surface of the third via 580 and the bottom surface of the third base layer 560 may be substantially flat. Another end of the third via 580 may extend toward the front surface of the fourth semiconductor chip 550 so as to be connected to the third circuit layer 570. The third via 580 may be connected to the third circuit pattern 574 of the third circuit layer 570.

A passivation layer may be provided on the bottom surface of the third base layer 560. The passivation layer may cover the bottom surface of the third base layer 560, and the third via 580 may penetrate the passivation layer so as to be exposed at a bottom surface of the passivation layer. The passivation layer may include an insulating material.

The fourth semiconductor chip 550 may be bonded to the second semiconductor chip 500. For example, the third base layer 560 of the fourth semiconductor chip 550 may be in contact with the top surface of the first circuit layer 520 of the second semiconductor chip 500. Here, the third via 580 of the fourth semiconductor chip 550 may be connected to the first circuit pattern 522 of the first circuit layer 520 of the second semiconductor chip 500. In more detail, the top surface of the first circuit layer 520 of the second semiconductor chip 500 may be in contact with the bottom surface of the third via 580 of the fourth semiconductor chip 550 at a boundary of the second semiconductor chip 500 and the fourth semiconductor chip 550. The first circuit layer 520 may be hybrid-bonded to the third via 580. For example, the first circuit layer 520 and the third via 580 may constitute a continuous component, and an interface between the first circuit layer 520 and the third via 580 may not be visible. Thus, the first circuit layer 520 and the third via 580 may have the continuous component. The second semiconductor chip 500 and the fourth semiconductor chip 550 may be electrically connected to each other through the first circuit layer 520 and the third via 580.

A fourth molding layer 720 may be disposed on the second molding layer 710. The fourth molding layer 720 may cover the top surface of the second molding layer 710. The fourth molding layer 720 may be disposed adjacent to a side surface of the fourth semiconductor chip 550. In detail, the fourth molding layer 720 may be disposed adjacent to both side surfaces of the fourth semiconductor chip 550. For example, the fourth molding layer 720 may surround the fourth semiconductor chip 550 in a plan view. The fourth molding layer 720 may cover the side surfaces of the fourth semiconductor chip 550. The fourth molding layer 720 may protect the fourth semiconductor chip 550. Here, the fourth molding layer 720 may expose the front (i.e., top) surface of the fourth semiconductor chip 550. A top surface of the fourth molding layer 720 may be coplanar with the front surface of the fourth semiconductor chip 550, and the top surface of the fourth molding layer 720 and the front surface of the fourth semiconductor chip 550 may be substantially flat. An interface of the fourth molding layer 720 and the second molding layer 710 may be provided in the same plane as an interface of the second semiconductor chip 500 and the fourth semiconductor chip 550. A side surface of the fourth molding layer 720 may be vertically aligned with the side surface of the second molding layer 710 and the side surface of the redistribution substrate 400. For example, the side surface of the fourth molding layer 720, the side surface of the second molding layer 710 and the side surface of the redistribution substrate 400 may be located in the same plane. The fourth molding layer 720 may include an insulating material.

The third semiconductor chip 600 may form a chip-on-wafer (COW) structure with the fourth semiconductor chip 550. The width of the fourth semiconductor chip 550 may be less than the width of the third semiconductor chip 600. The fourth semiconductor chip 550 may be in direct contact with the third semiconductor chip 600. In other words, a top surface of the third circuit layer 570 of the fourth semiconductor chip 550 may be in contact with the bottom surface of the second circuit layer 620 of the third semiconductor chip 600 at a boundary of the fourth semiconductor chip 550 and the third semiconductor chip 600. The third circuit layer 570 may be hybrid-bonded to the second circuit layer 620. For example, the third circuit pattern 574 of the third circuit layer 570 and the second circuit pattern 624 of the second circuit layer 620 may constitute a continuous component, and an interface between the third and second circuit patterns 574 and 624 may not be visible. In other words, the third and second circuit patterns 574 and 624 may be provided as a single component. The fourth semiconductor chip 550 and the third semiconductor chip 600 may be electrically connected to each other through the third circuit pattern 574 and the second circuit pattern 624.

Figure 6:
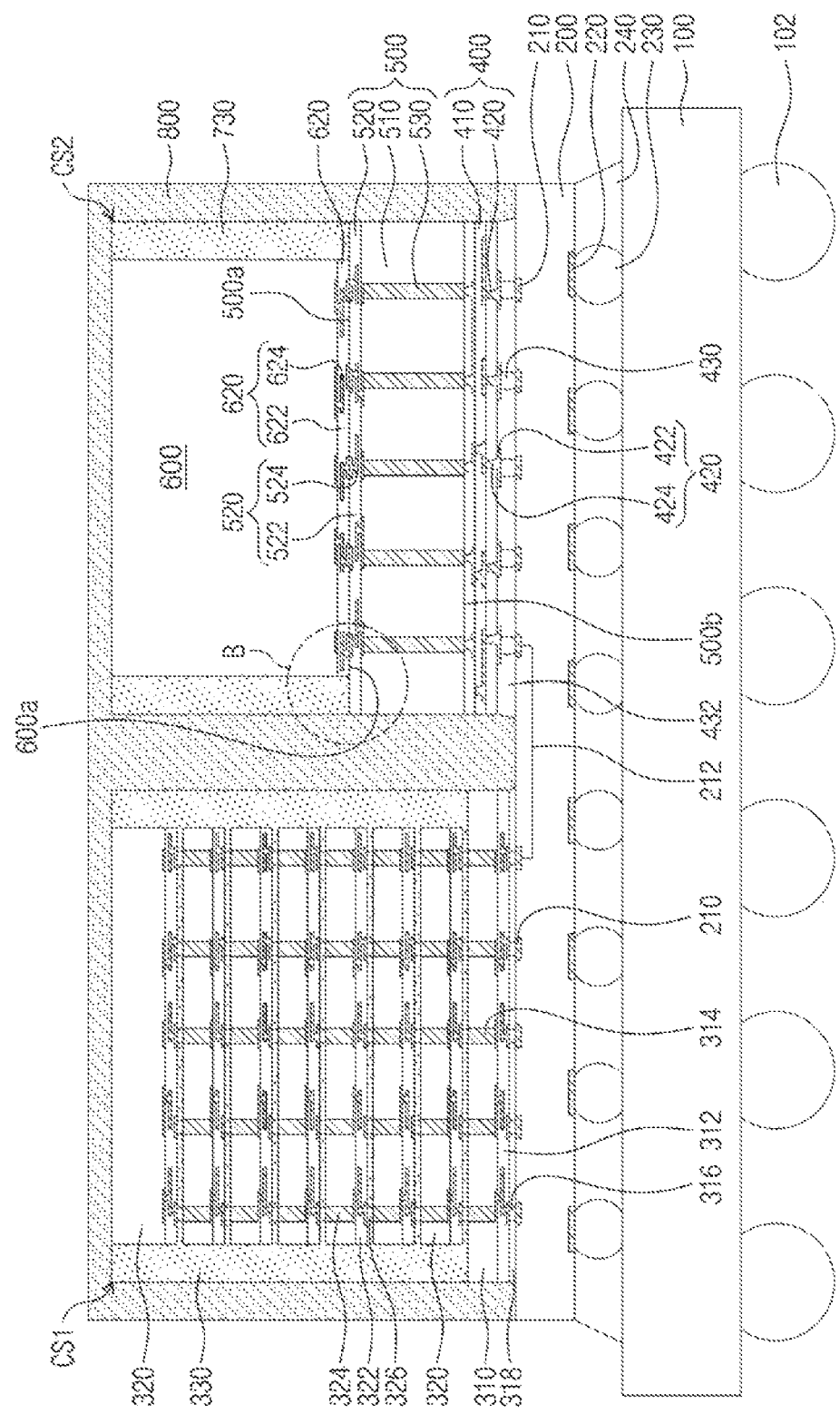
FIG. 6 is a cross-sectional view illustrating a semiconductor package according to some embodiments.
Figure 7:
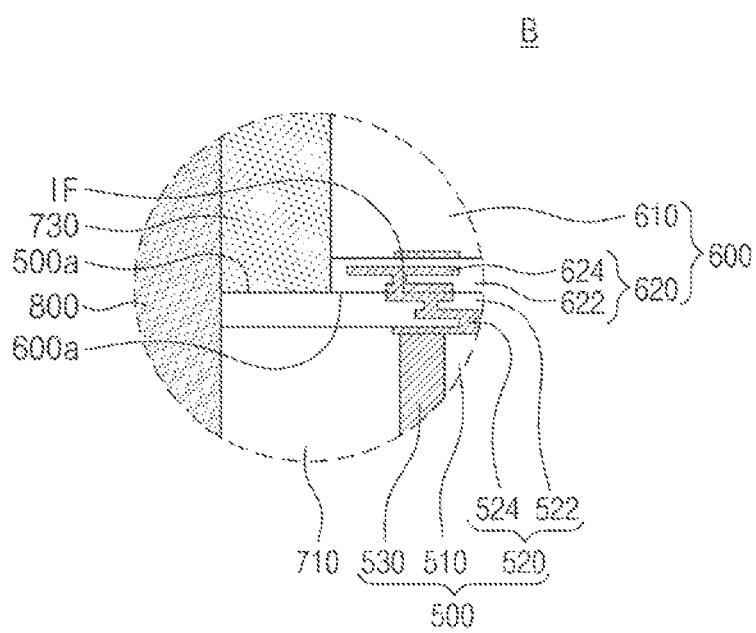
FIG. 7 is an enlarged view of a region 'B' of FIG. 6.

FIG. 6 is a cross-sectional view illustrating a semiconductor package according to some example embodiments. FIG. 7 is an enlarged view of a region 'B' of FIG. 6.

Referring to FIGS. 6 and 7, a width of the second semiconductor chip 500 may be equal to the width of the redistribution substrate 400. A side surface of the second semiconductor chip 500 may be vertically aligned with the side surface of the redistribution substrate 400. In the embodiments of FIGS. 6 and 7, in contrast to an embodiment shown in FIG. 1, the second molding layer 710 (see FIG. 1) surrounding the second semiconductor chip 500 may not be provided.

The third semiconductor chip 600 may be disposed on the second semiconductor chip 500. A width of the third semiconductor chip 600 may be less than the width of the redistribution substrate 400 and less than the width of the second semiconductor chip 500. For example, a side surface of the third semiconductor chip 600 may have a shape recessed from the side surface of the second semiconductor chip 500. The third semiconductor chip 600 may be bonded onto the second semiconductor chip 500. Like the description in FIG. 2, the third semiconductor chip 600 may form a chip-on-wafer (COW) structure with the second semiconductor chip 500. The width of the second semiconductor chip 500 may be greater than the width of the third semiconductor chip 600. The second semiconductor chip 500 may be in direct contact with the third semiconductor chip 600. The first circuit layer 520 may be hybrid-bonded to the second circuit layer 620.

A fifth molding layer 730 may be disposed on the top surface of the second semiconductor chip 500. The fifth molding layer 730 may at least partially cover the top surface of the second semiconductor chip 500. The fifth molding layer 730 may be disposed adjacent to a side surface of the third semiconductor chip 600. In detail, the fifth molding layer 730 may be disposed adjacent to both side surfaces of the third semiconductor chip 600. For example, the fifth molding layer 730 may surround the third semiconductor chip 600 in a plan view. The fifth molding layer 730 may cover the side surfaces of the third semiconductor chip 600. The fifth molding layer 730 may protect the third semiconductor chip 600. Here, the fifth molding layer 730 may expose the back (i.e., top) surface of the third semiconductor chip 600. In other words, the fifth molding layer 730 may not cover or contact the back surface of the third semiconductor chip 600. A bottom surface of the fifth molding layer 730 may be coplanar with the front (i.e., bottom) surface of the third semiconductor chip 600, and the bottom surface of the fifth molding layer 730 and the front surface of the third semiconductor chip 600 may be substantially flat. A side surface of the fifth molding layer 730 may be vertically aligned with the side surface of the second semiconductor chip 500. For example, the side surface of the fifth molding layer 730, the side surface of the second semiconductor chip 500 and the side surface of the redistribution substrate 400 may be located in the same plane. The fifth molding layer 730 may include an insulating material.

Figure 8:
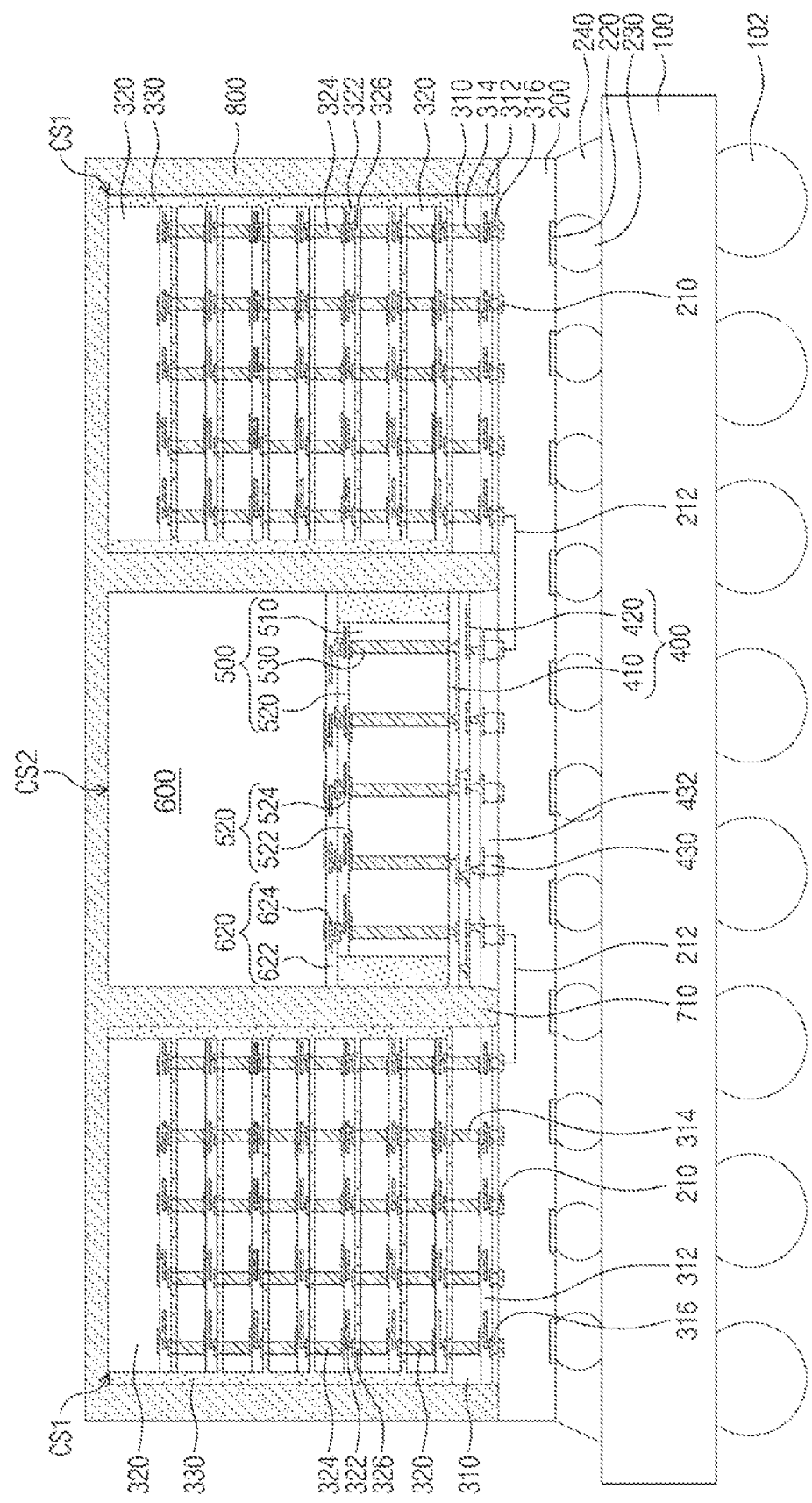
FIG. 8 is a cross-sectional view illustrating a semiconductor package according to some embodiments.

FIG. 8 is a cross-sectional view illustrating a semiconductor package according to some example embodiments.

Referring to FIG. 8, a first chip stack CS1 may be provided in plurality. The first chip stacks CS1 may be spaced apart from each other. The second chip stack CS2 may be disposed between the first chip stacks CS1. Each of the first chip stacks CS1 may be the same as or similar to the first chip stack CS1 described with reference to FIG. 1. For example, each of the first chip stacks CS1 may include the base semiconductor chip 310, the first semiconductor chips 320 stacked on the base semiconductor chip 310, and the first molding layer 330 surrounding the first semiconductor chips 320. The first chip stacks CS1 and the second chip stack CS2 may be electrically connected to each other through circuit interconnection lines 212 provided in the interposer substrate 200.

FIGS. 9 to 19 are cross-sectional views illustrating a method for manufacturing a semiconductor package according to some example embodiments.

Figure 9:
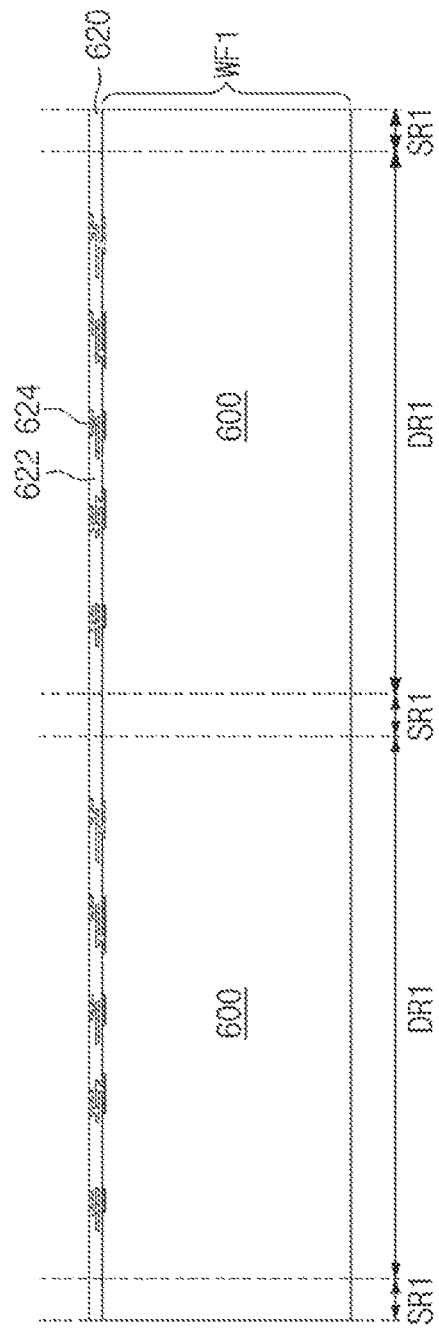
FIGS. 9 to 19 are cross-sectional views illustrating a method for manufacturing a semiconductor package according to some embodiments.

Referring to FIG. 9, a first wafer WF1 may be provided. The first wafer WF1 may be a semiconductor wafer. For example, the first wafer WF1 may be a silicon wafer, a germanium wafer, or a silicon-germanium wafer. The first wafer WF1 may include first device regions DR1 spaced apart from each other in one direction, and a first scribe region SR1 defining the first device regions DR1. The first device regions DR1 of the first wafer WF1 may be regions in which third semiconductor chips 600 are formed. The first scribe region SR1 of the first wafer WF1 may be a region on which a sawing process for singulation of the third semiconductor chips 600 will be performed later.

The third semiconductor chips 600 may be formed on the first device regions DR1 of the first wafer WF1, respectively. The third semiconductor chips 600 may be formed on a top surface of the first wafer WF1. Integrated circuits of the third semiconductor chips 600 may be formed on the top surface of the first wafer WF1. The integrated circuits of the third semiconductor chips 600 may be logic circuits.

Second circuit layers 620 of the third semiconductor chips 600 may be formed on the top surface of the first wafer WF1. For example, an insulating layer (e.g., silicon oxide (SiO)) may be formed on the top surface of the first wafer WF1, and then, the insulating layer may be patterned to form a portion of a second insulating pattern 622. A conductive layer may be formed on a top surface of the second insulating pattern 622, and then, the conductive layer may be patterned to form a second circuit pattern 624. The second circuit pattern 624 may be electrically connected to the integrated circuit of the third semiconductor chip 600. The processes of forming and patterning the insulating layer and the processes of forming and patterning the conductive layer may be repeated to form the second circuit layer 620.

Figure 10:
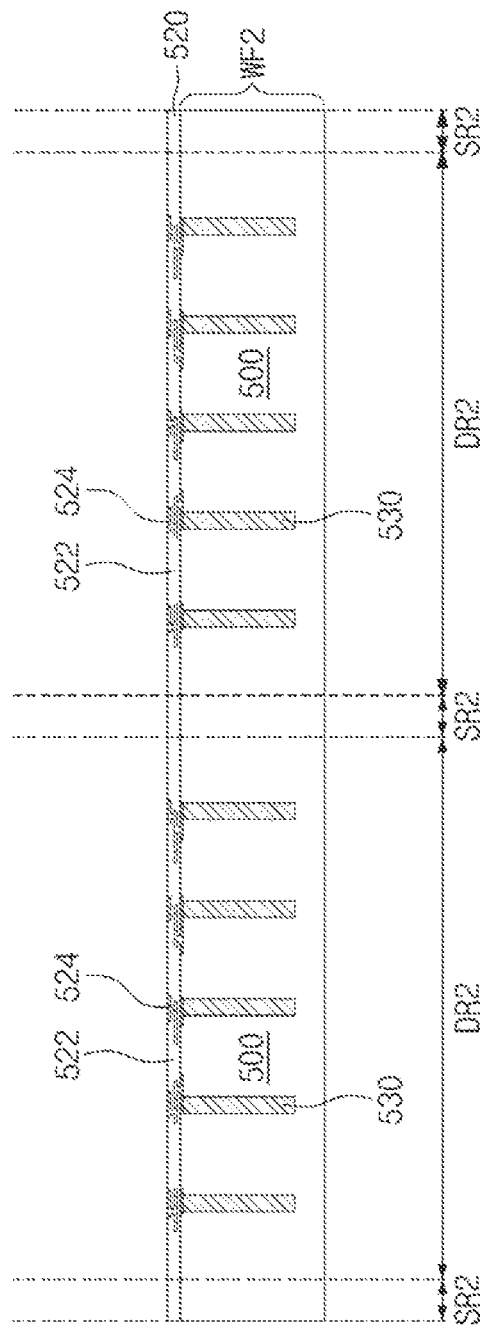

Referring to FIG. 10, a second wafer WF2 may be provided. The second wafer WF2 may be a semiconductor wafer. For example, the second wafer WF2 may be a silicon wafer, a germanium wafer, or a silicon-germanium wafer. The second wafer WF2 may include second device regions DR2 spaced apart from each other in one direction, and a second scribe region SR2 defining the second device regions DR2. The second device regions DR2 of the second wafer WF2 may be regions in which second semiconductor chips 500 are formed. The second scribe region SR2 of the second wafer WF2 may be a region on which a sawing process for singulation of the second semiconductor chips 500 will be performed later.

The second semiconductor chips 500 may be formed on the second device regions DR2 of the second wafer WF2, respectively. The second semiconductor chips 500 may be formed on a top surface of the second wafer WF2. Integrated circuits of the second semiconductor chips 500 may be formed on the top surface of the second wafer WF2. The integrated circuit of the second semiconductor chip 500 may be a memory circuit.

Holes may be formed in the second wafer WF2. The holes may be formed by performing a laser drilling process on the top surface of the second wafer WF2. Alternatively, a mask pattern may be formed on the top surface of the second wafer WF2, and then, an anisotropic etching process may be performed on the second wafer WF2 by using the mask pattern as an etch mask, thereby forming the holes. The holes may not completely penetrate the second wafer WF2 in a vertical direction. In other words, bottoms of the holes may not reach a bottom surface of the second wafer WF2.

First vias 530 may be formed in the second wafer WF2. For example, a conductive material may be coated or deposited on the top surface of the second wafer WF2. At this time, the conductive material may fill the holes of the second wafer WF2. Thereafter, a portion of the conductive material on the top surface of the second wafer WF2 may be removed, and thus the conductive material may remain only in the holes.

First circuit layers 520 of the second semiconductor chips 500 may be formed on the top surface of the second wafer WF2. For example, an insulating layer (e.g., silicon oxide (SiO)) may be formed on the top surface of the second wafer WF2, and then, the insulating layer may be patterned to form a portion of a first insulating pattern 522. A conductive layer may be formed on a top surface of the first insulating pattern 522, and then, the conductive layer may be patterned to form a first circuit pattern 524. The first circuit pattern 524 may be electrically connected to the integrated circuit of the second semiconductor chip 500 and the first vias 530. The processes of forming and patterning the insulating layer and the processes of forming and patterning the conductive layer may be repeated to form the first circuit layer 520.

Figure 11:
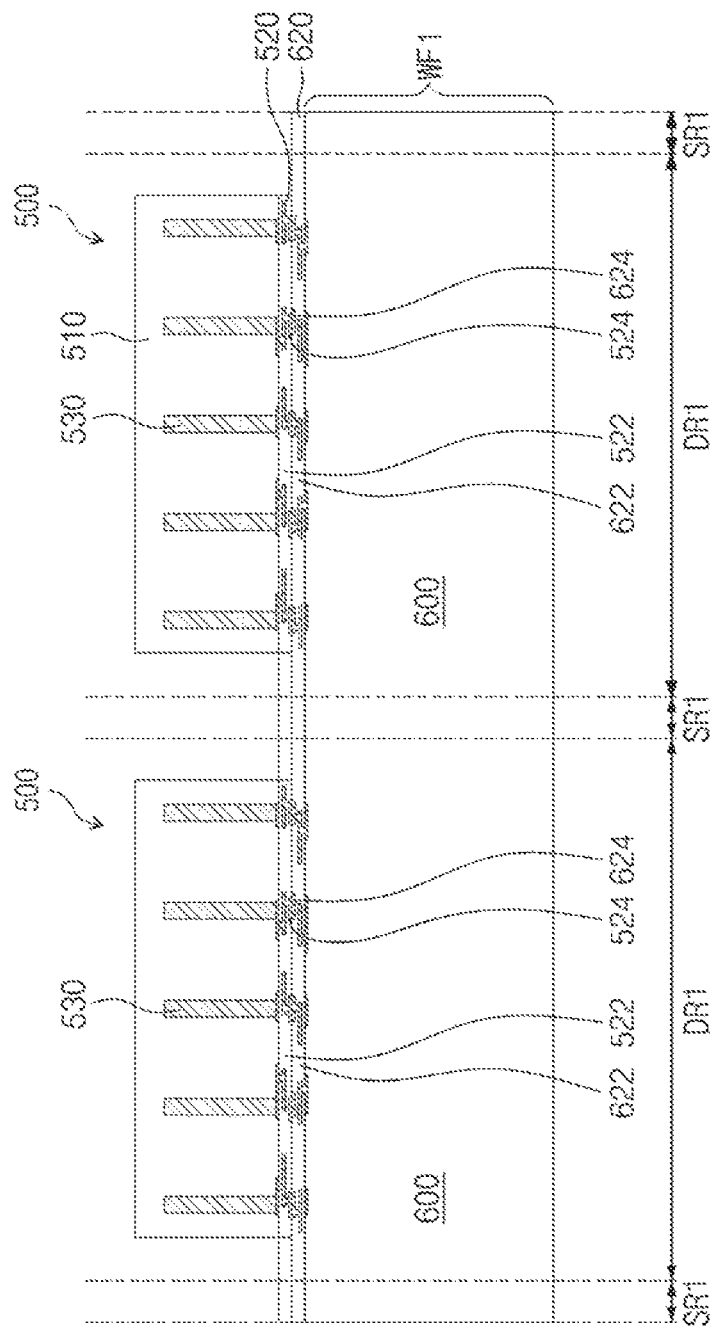

Referring to FIG. 11, a singulation process may be performed on the resultant structure of FIG. 10. For example, a sawing process may be performed along the second scribe region SR2 (see FIG. 10) of the second wafer WF2. The second scribe region SR2 of the second wafer WF2 may be sawed. Thus, a plurality of the second semiconductor chips 500 may be separated from each other. Widths of the second semiconductor chips 500 may be less than widths of the third semiconductor chips 600.

The second semiconductor chips 500 may be bonded onto the first wafer WF1. The second semiconductor chips 500 may be bonded onto the first wafer WF1 by a chip-on-wafer (COW) method. For example, the second semiconductor chips 500 may be aligned on the third semiconductor chips 600 of the first wafer WF1, respectively. At this time, side surfaces of the second semiconductor chips 500 may be spaced apart from the first scribe region SR1. The first circuit layers 520 of the second semiconductor chips 500 may face the second circuit layers 620 of the third semiconductor chips 600. The second semiconductor chips 500 may be in contact with the third semiconductor chips 600. At this time, an exposed portion of the first circuit pattern 524 of the first circuit layer 520 may be in contact with an exposed portion of the second circuit pattern 624 of the second circuit layer 620. The exposed portion of the first circuit pattern 524 of the first circuit layer 520 may be bonded to the exposed portion of the second circuit pattern 624 of the second circuit layer 620. For example, the first circuit pattern 524 and the second circuit pattern 624 may be bonded to each other to form one body. The bonding of the first circuit pattern 524 and the second circuit pattern 624 may be naturally performed. In more detail, the first circuit pattern 524 and the second circuit pattern 624 may be formed of the same material (e.g., copper (Cu)), and the first circuit pattern 524 and the second circuit pattern 624 may be bonded to each other by a hybrid-bonding process (e.g., a copper (Cu)-copper (Cu) hybrid-bonding process) performed by surface activation at an interface of the first and second circuit patterns 524 and 624 being in contact with each other. The first circuit pattern 524 and the second circuit pattern 624 may be bonded to each other, and thus the interface between the first circuit pattern 524 and the second circuit pattern 624 may disappear.

In some embodiments, to easily bond the first and second circuit patterns 524 and 624, a surface activation process may be performed on surfaces of the first and second circuit patterns 524 and 624. The surface activation process may include a plasma process. In addition, pressure and heat may be applied to the first wafer WF1 to easily bond the first and second circuit patterns 524 and 624. The applied pressure may be less than, for example, about 30 MPa. The applied heat may be provided by an annealing process performed at a temperature of about 100 degrees Celsius to about 500 degrees Celsius. In certain embodiments, different pressure and/or a different temperature of heat may be used in the hybrid-bonding process.

The first circuit pattern 524 and the second circuit pattern 624 may be bonded to each other to constitute one body, and thus the second semiconductor chips 500 may be firmly bonded to the respective third semiconductor chips 600 of the first wafer WF1. As a result, a semiconductor package with improved structural stability may be manufactured.

Figure 12:
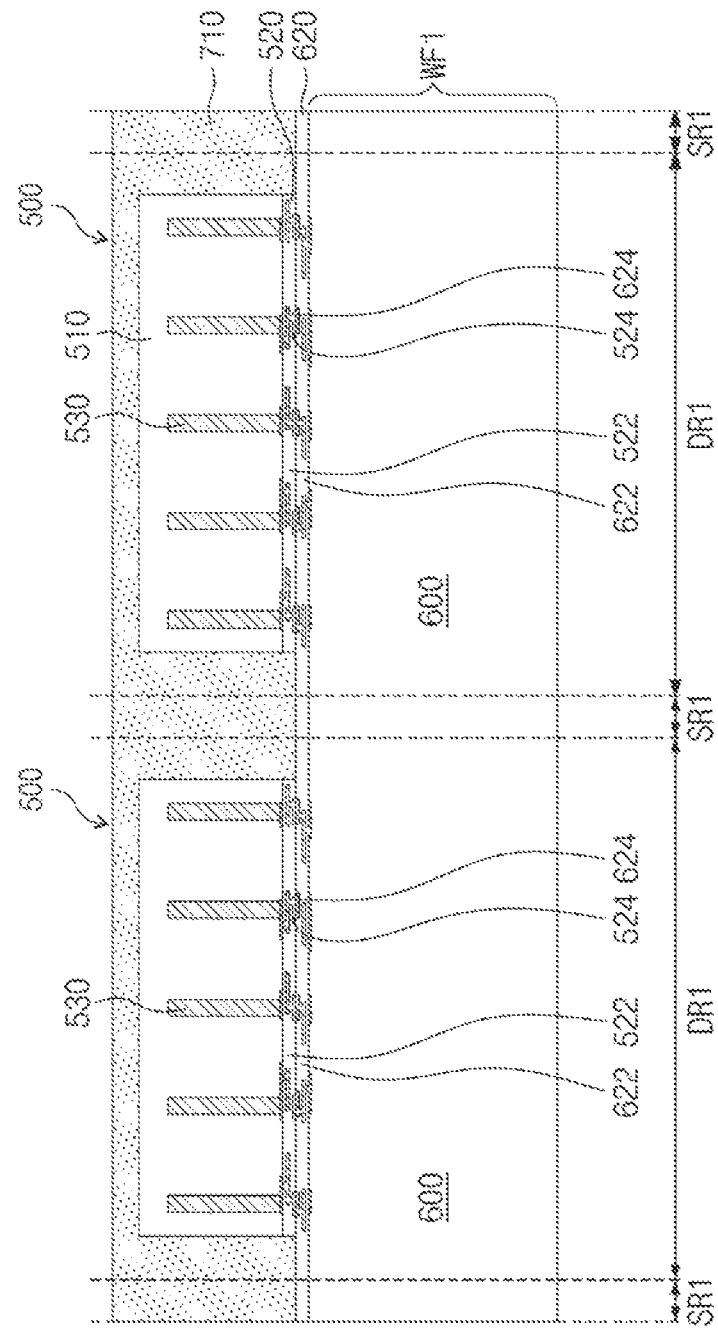

Referring to FIG. 12, a second molding layer 710 may be formed on the first wafer WF1. For example, a molding material may be applied onto the top surface of the first wafer WF1 to cover the second semiconductor chips 500, and the molding material may be hardened to form the second molding layer 710. The second molding layer 710 may at least partially cover the top surface of the first wafer WF1, side surfaces of the second semiconductor chips 500, and back surfaces of the second semiconductor chips 500. The molding material may include an insulating material.

Figure 13:
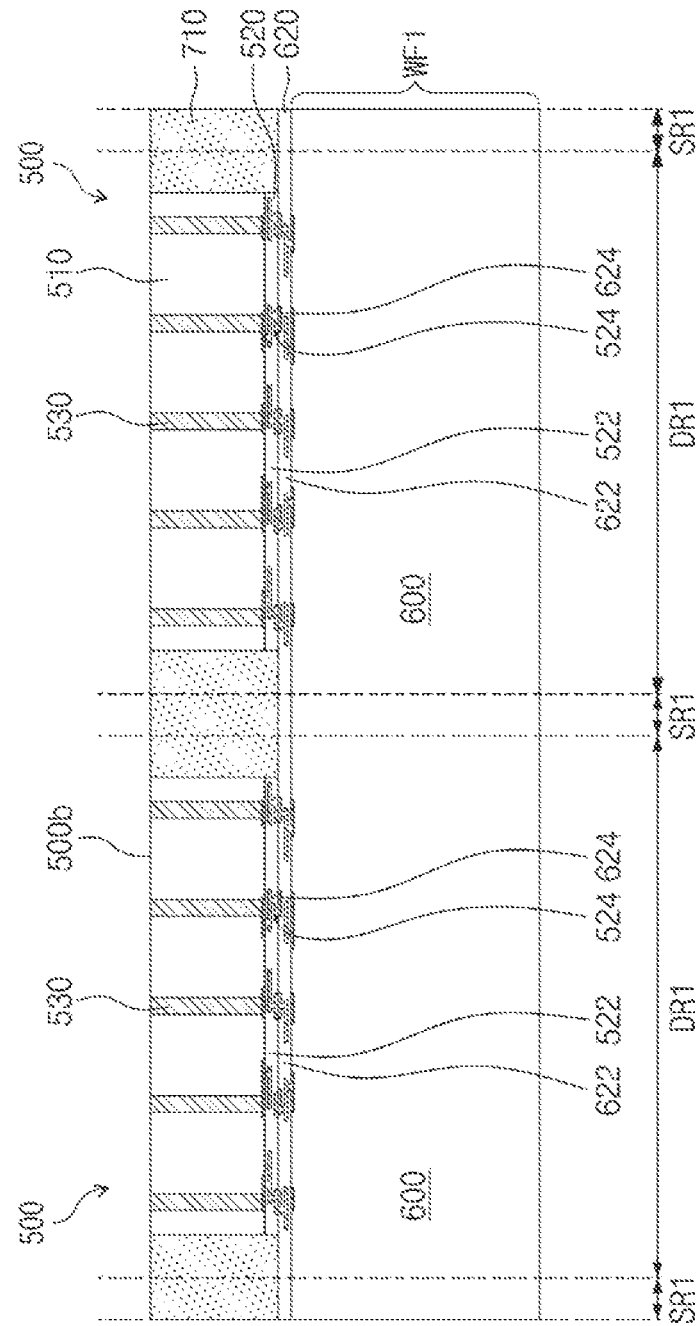

Referring to FIG. 13, a portion of the second molding layer 710 and portions of the second semiconductor chips 500 may be removed. In other words, the second semiconductor chips 500 may be thinned in a vertical direction. For example, a grinding process or a chemical mechanical polishing (CMP) process may be performed on a top surface of the second molding layer 710. Thus, the back (i.e., top) surfaces of the second semiconductor chips 500 and the top surface of the second molding layer 710 may be planarized. By the thinning process, an upper portion of the second molding layer 710 may be removed and upper portions of the second semiconductor chips 500 may also be removed.

After the thinning process is performed, the back surfaces 500b of the second semiconductor chips 500 may be exposed from the top surface of the second molding layer 710. The back surfaces 500b of the second semiconductor chips 500 and the top surface of the second molding layer 710 may be substantially flat and may be coplanar with each other. At this time, the first vias 530 of the second semiconductor chips 500 may be exposed at the back surfaces 500b of the second semiconductor chips 500. Exposed top surfaces of the first vias 530 may be flat.

According to the example embodiments of the disclosure, the second semiconductor chips 500 may first be bonded to the third semiconductor chips 600 by using the metal-to-metal bonding process having strong bonding strength, and then, the thinning process may be performed on the second semiconductor chips 500. Thus, the possibility of detachment and breakage of the second semiconductor chips 500 may be reduced or minimized, and the second semiconductor chips 500 having thin thicknesses may be formed. As a result, a size of the semiconductor package may be reduced.

In the example embodiments of FIGS. 11 to 13, the second molding layer 710 may be formed after the second semiconductor chips 500 are bonded to the third semiconductor chips 600. However, embodiments of the disclosure are not limited thereto.

In certain example embodiments, a singulation process may be performed on the resultant structure of FIG. 10. For example, the second scribe region SR2 of the second wafer WF2 may be sawed. Thus, a plurality of the second semiconductor chips 500 may be separated from each other.

Figure 14:
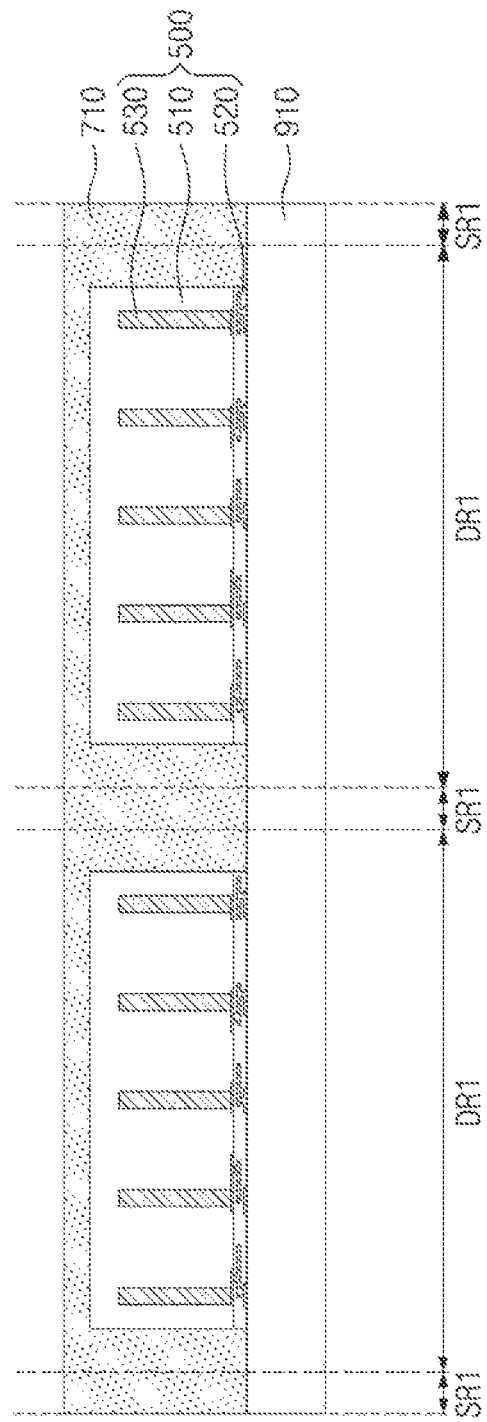

Referring to FIG. 14, a first carrier substrate 910 may be provided. The first carrier substrate 910 may be an insulating substrate including a glass or a polymer or may be a conductive substrate including a metal. An adhesive member may be provided on a top surface of the first carrier substrate 910. For example, the adhesive member may include an adhesive tape.

The second semiconductor chips 500 may be adhered onto the first carrier substrate 910. For example, a surface of the first circuit layer 520 may be adhered to the adhesive member of the first carrier substrate 910.

A second molding layer 710 may be formed on the first carrier substrate 910. For example, a molding material may be applied onto the top surface of the first carrier substrate 910 to cover the second semiconductor chips 500, and the molding material may be hardened to form the second molding layer 710. The second molding layer 710 may cover side surfaces and top surfaces of the second semiconductor chips 500.

Figure 15:
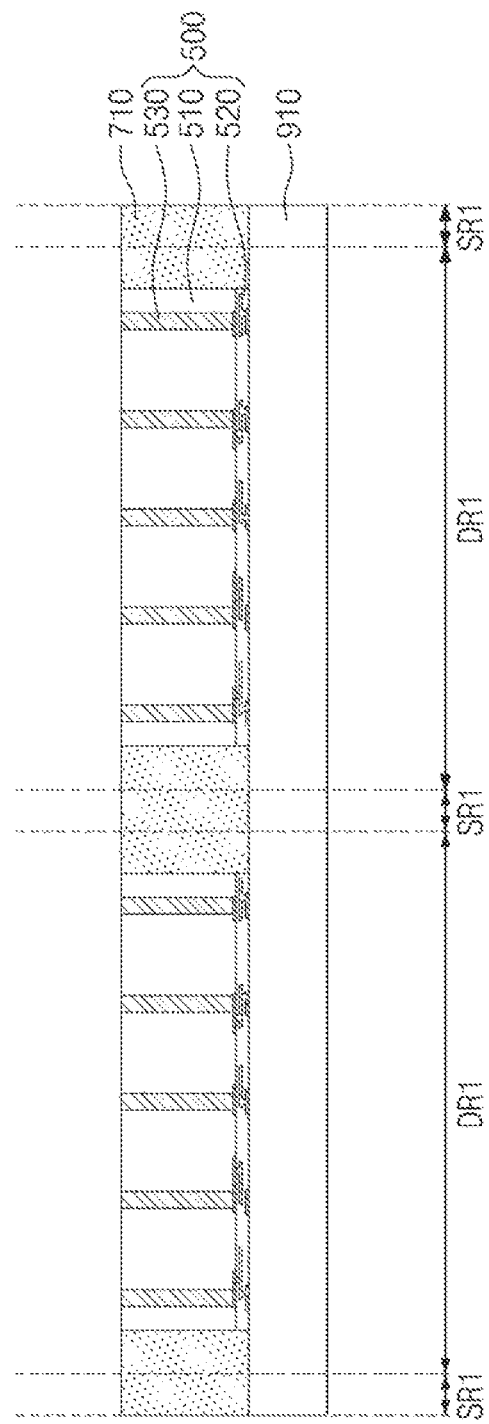

Referring to FIG. 15, a portion of the second molding layer 710 may be removed. In other words, the second molding layer 710 may be thinned. For example, a grinding process or a chemical mechanical polishing (CMP) process may be performed on a top surface of the second molding layer 710. Thus, the top surface of the second molding layer 710 may be planarized. The thinning process may be performed until the second semiconductor chips 500 are exposed from the second molding layer 710. Upper portions of the second semiconductor chips 500 may also be removed by the thinning process.

After the thinning process is performed, the first vias 530 of the second semiconductor chips 500 may be exposed from the top surface of the second molding layer 710. Back (i.e., top) surfaces of the second semiconductor chips 500, top surfaces of the first vias 530 and the top surface of the second molding layer 710 may be substantially flat and may be substantially coplanar with each other.

After the thinning process, the first carrier substrate 910 may be removed. For example, the first carrier substrate 910 may be detached by melting the adhesive member, or the first carrier substrate 910 may be physically removed.

Referring again to FIG. 13, the second semiconductor chips 500 may be bonded onto the first wafer WF1 manufactured through the processes of FIG. 9. The second semiconductor chips 500 may be aligned on the third semiconductor chips 600 of the first wafer WF1, respectively. The first circuit layers 520 of the second semiconductor chips 500 may face the second circuit layers 620 of the third semiconductor chips 600. The second semiconductor chips 500 and the second molding layer 710 may be in contact with the third semiconductor chips 600. The exposed portion of the first circuit pattern 524 of the first circuit layer 520 may be bonded to the exposed portion of the second circuit pattern 624 of the second circuit layer 620. The bonding of the first circuit pattern 524 and the second circuit pattern 624 may be naturally performed. In more detail, the first circuit pattern 524 and the second circuit pattern 624 may be bonded to each other by the hybrid-bonding process performed by the surface activation at the interface of the first and second circuit patterns 524 and 624 being in contact with each other. The first circuit pattern 524 and the second circuit pattern 624 may be bonded to each other, and thus the interface between the first circuit pattern 524 and the second circuit pattern 624 may disappear.

Figure 16:
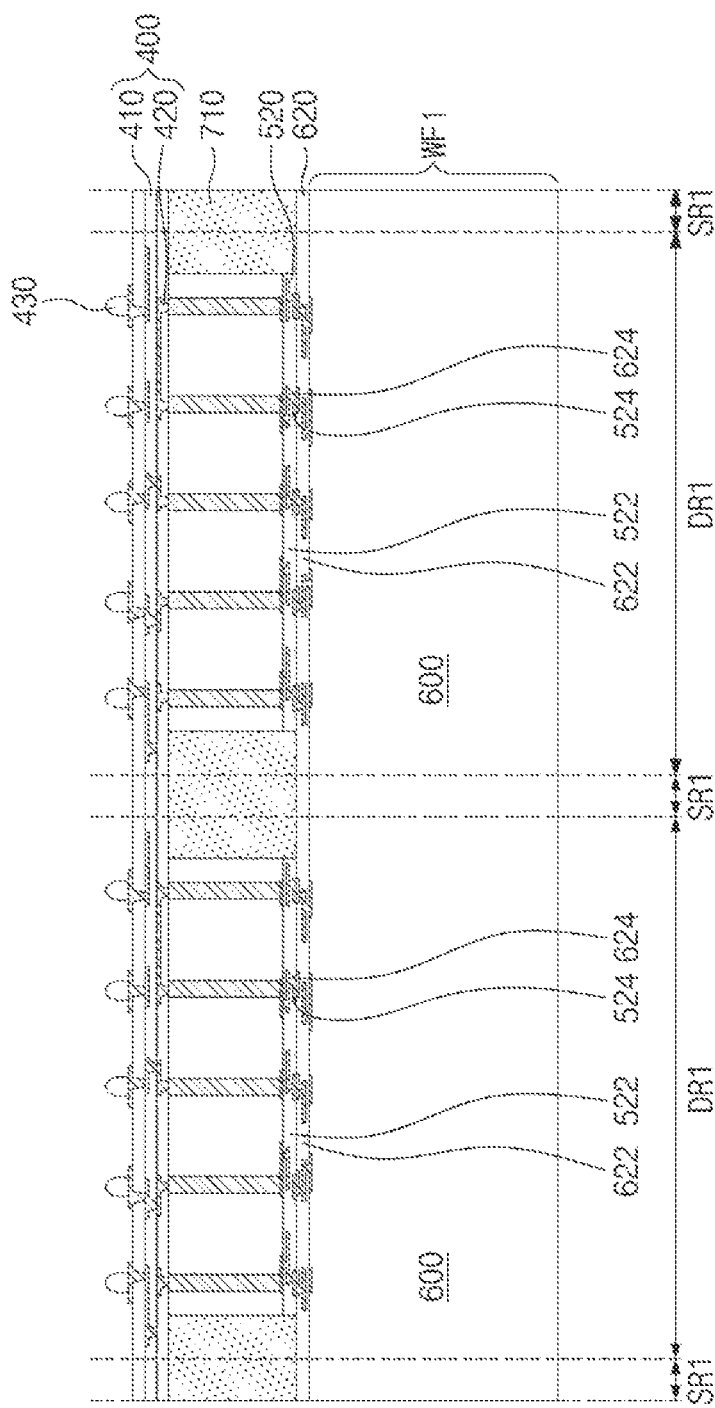

Referring to FIG. 16, a redistribution substrate 400 may be formed on the resultant structure of FIG. 13. For example, an insulating pattern 410 may be formed on the second semiconductor chips 500 and the second molding layer 710. The insulating pattern 410 may include an insulating polymer or a photo-imageable dielectric (PID). A conductive pattern 420 may be formed in the insulating pattern 410. For example, the insulating pattern 410 may be patterned to form openings for forming the conductive pattern 420, a seed layer may be conformally formed in the openings, and a plating process may be performed using the seed layer as a seed to form the conductive pattern 420 filling the openings. One redistribution layer may be formed as described above.

Another insulating pattern 410 may be formed on the one redistribution layer. The insulating pattern 410 may be formed by a coating process such as a spin coating process or a slit coating process. The insulating pattern 410 may include a photo-imageable dielectric (PID). The insulating pattern 410 may have a first opening exposing the conductive pattern 420 of the redistribution layer provided thereunder, and a second opening provided on the first opening and having a width greater than that of the first opening. A seed layer may be conformally formed in the first opening and the second opening, and a plating process may be performed using the seed layer as a seed to form a conductive pattern 420 filling the first and second openings. Other redistribution layer(s) may be formed on the one redistribution layer as described above. The conductive pattern 420 of an uppermost redistribution layer may be exposed at a top surface of the corresponding insulating pattern 410.

However, embodiments of the disclosure are not limited to the above example of forming the redistribution substrate 400.

Figure 17:
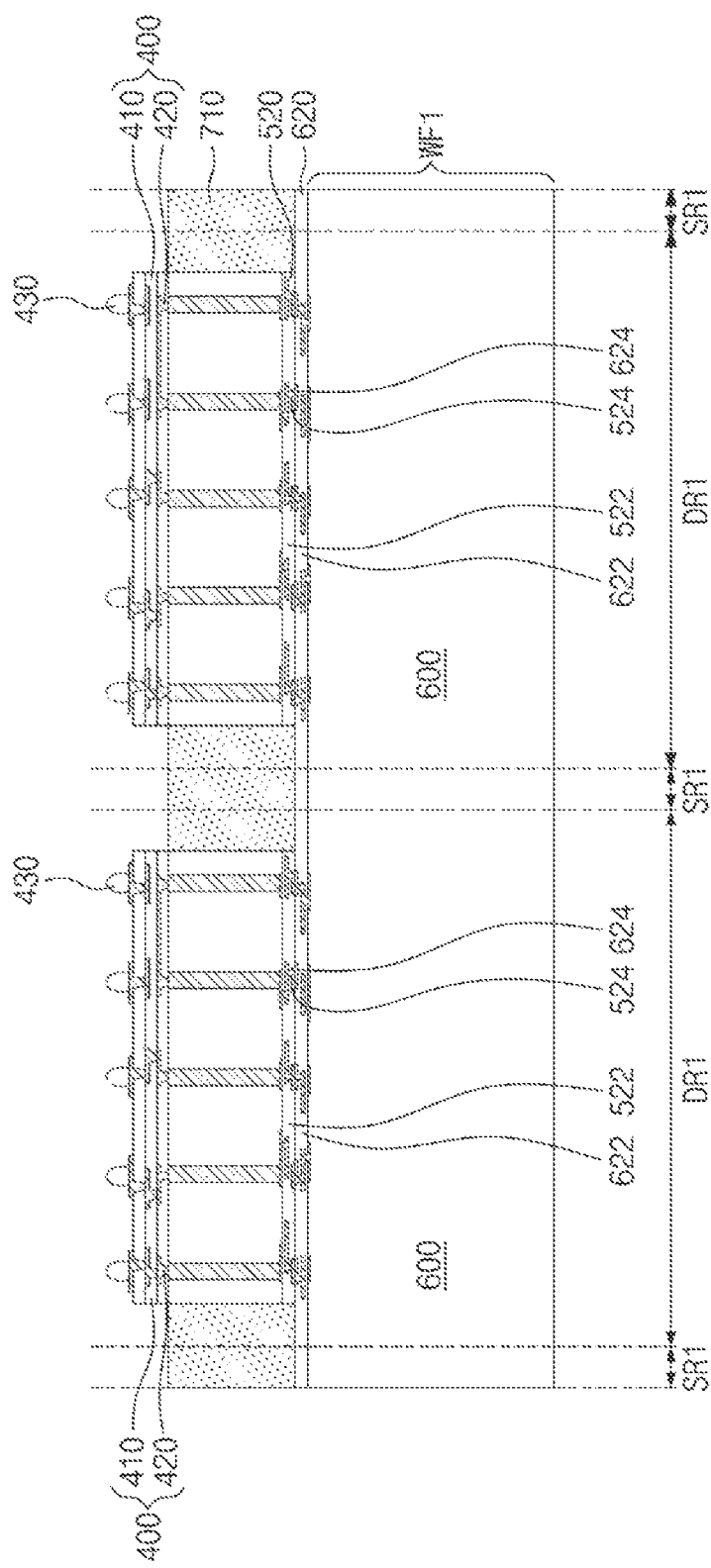

In FIG. 16, the redistribution substrate 400 is formed on the second semiconductor chips 500 and the second molding layer 710. However, embodiments of the disclosure are not limited thereto. As illustrated in FIG. 17, the redistribution substrate 400 may be formed in plurality, and the redistribution substrates 400 may be formed on the second semiconductor chips 500, respectively. For example, in the patterning process of the insulating pattern 410, an insulating material located on the second molding layer 710 may be removed.

Referring again to FIG. 16, second connection terminals 430 may be formed on the redistribution substrate 400. For example, solder balls or solder bumps may be provided on the exposed conductive patterns 420 of the uppermost redistribution layer.

Figure 18:
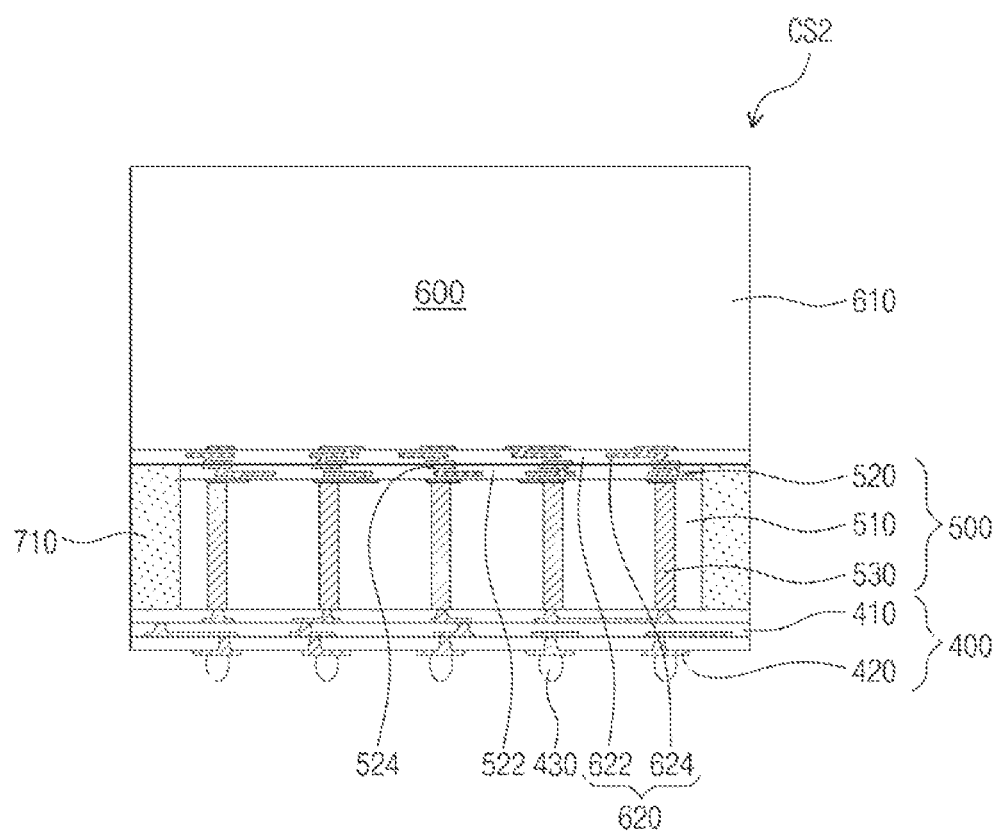

Referring to FIG. 18, a singulation process may be performed on the resultant structure of FIG. 16. For example, a sawing process may be performed along the first scribe region SR1 (see FIG. 16) of the first wafer WF1. The redistribution substrate 400 and the second molding layer 710 on the first scribe region SR1 and the first wafer WF1 may be sequentially sawed. Thus, a plurality of second chip stacks CS2 may be separated from each other.

Figure 19:
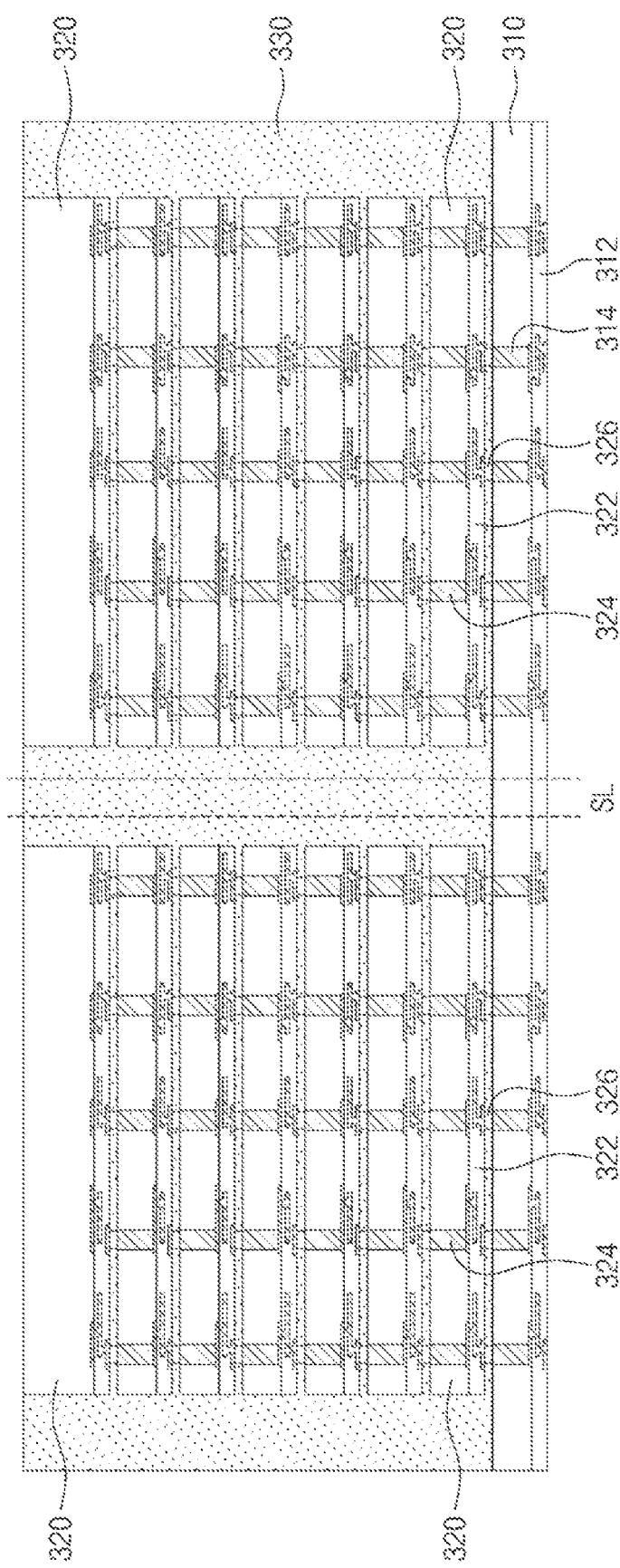

Referring to FIG. 19, a first chip stack CS1 may be formed. For example, base semiconductor chips 310 may be formed on a wafer-level semiconductor substrate formed of a semiconductor material (e.g., silicon). Each of the base semiconductor chips 310 may include a base circuit layer 312 and a base through-electrode 314. The base circuit layer 312 may be provided on a bottom surface of the base semiconductor chip 310. The bottom surface of the base semiconductor chip 310 may be an active surface.

First semiconductor chips 320 may be mounted on the base semiconductor chip 310. Each of the first semiconductor chips 320 may include a circuit layer 322 and a through-electrode 324. A bottom surface of each of the first semiconductor chips 320 may be an active surface. First bumps 326 may be provided on the bottom surface of each of the first semiconductor chips 320. The first bumps 326 may be provided between the base semiconductor chip 310 and the first semiconductor chips 320 to electrically connect the base semiconductor chip 310 and the first semiconductor chips 320 to each other. Other first semiconductor chips 320 may be stacked on the first semiconductor chips 320. For example, the plurality of first semiconductor chips 320 may be stacked on the base semiconductor chip 310. At this time, the first bumps 326 may also be formed between adjacent first semiconductor chips 320 in a vertical direction.

A first molding layer 330 may be formed on top surfaces of the base semiconductor chips 310 to cover the first semiconductor chips 320. A top surface of the first molding layer 330 may be higher than a top surface of an uppermost first semiconductor chip 320. The first molding layer 330 may surround the first semiconductor chips 320 when viewed in a plan view. The first molding layer 330 may include an insulating polymer material. For example, the first molding layer 330 may include an epoxy molding compound (EMC).

A portion of the first molding layer 330 and a portion of the uppermost first semiconductor chip 320 may be removed. For example, a grinding process may be performed on the top surface of the first molding layer 330. An upper portion of the first molding layer 330 may be removed. Thus, the top surface of the first molding layer 330 may be coplanar with the top surface of the uppermost first semiconductor chip 320 as shown in FIG. 19.

Referring again to FIG. 1, a singulation process may be performed on the resultant structure of FIG. 19. For example, the first molding layer 330 and the base semiconductor chip 310 may be sawed to separate the first chip stacks CS1 from each other. In other words, the first molding layer 330 and the base semiconductor chip 310 may be sawed along a sawing line SL located between the first semiconductor chips 320, and thus the first semiconductor chips 320 may be separated from each other and the base semiconductor chips 310 may be separated from each other.

An interposer substrate 200 may be provided as shown, for example, in FIGS. 1, 3-6, and 8. The interposer substrate 200 may include first substrate pads 210 exposed at a top surface of the interposer substrate 200, and second substrate pads 220 exposed at a bottom surface of the interposer substrate 200.

The first chip stack CS1 and the second chip stack CS2 may be mounted on the interposer substrate 200. The first chip stack CS1 and the second chip stack CS2 may be mounted on the interposer substrate 200 by a flip chip method. The first connection terminals 316 may be provided on a bottom surface of the first chip stack CS1, and the second connection terminals 430 may be provided on a bottom surface of the second chip stack CS2. The first and second connection terminals 316 and 430 may include solder balls or solder bumps. A second underfill layer 318 may be provided on the bottom surface of the first chip stack CS1 to surround the first connection terminals 316, and a third underfill layer 432 may be provided on the bottom surface of the second chip stack CS2 to surround the second connection terminals 430. For example, each of the second and third underfill layers 318 and 432 may be a non-conductive adhesive or a non-conductive film. When each of the second and third underfill layers 318 and 432 is the non-conductive adhesive, the second and third underfill layers 318 and 432 may be formed by applying a liquid non-conductive adhesive to the bottom surfaces of the first and second chip stacks CS1 and CS2 through a dispensing process. When each of the second and third underfill layers 318 and 432 is the non-conductive film, the second and third underfill layers 318 and 432 may be formed by attaching the non-conductive films onto the bottom surfaces of the first and second chip stacks CS1 and CS2. The first connection terminals 316 and the second connection terminals 430 may be connected to the first substrate pads 210 of the interposer substrate 200.

A third molding layer 800 may be formed as shown, for example, in FIGS. 1, 3-6, and 8. For example, an insulating material may be applied onto the interposer substrate 200 to form the third molding layer 800. The third molding layer 800 may cover the first chip stack CS1 and the second chip stack CS2. In certain embodiments, a grinding process may be performed on the third molding layer 800. An upper portion of the third molding layer 800 may be removed. In this case, a top surface of the third molding layer 800 may be coplanar with a top surface of the first chip stack CS1 and a top surface of the second chip stack CS2.

The interposer substrate 200 may be mounted on a package substrate 100. The interposer substrate 200 may be mounted on the package substrate 100 by a flip chip method. For example, substrate terminals 230 may be provided on a bottom surface of the interposer substrate 200. The substrate terminals 230 may be provided on the second substrate pads 220 of the interposer substrate 200. The substrate terminals 230 may be connected to pads of the package substrate 100. A first underfill layer 240 may be formed between the interposer substrate 200 and the package substrate 100. For example, the first underfill layer 240 may be provided on the bottom surface of the interposer substrate 200 to surround the substrate terminals 230, and then, the interposer substrate 200 may be mounted on the package substrate 100.

External terminals 102 may be provided on a bottom surface of the package substrate 100. For example, the external terminals 102 may be disposed on terminal pads disposed on the bottom surface of the package substrate 100. The external terminals 102 may include solder balls or solder bumps.

The semiconductor package of FIG. 1 may be manufactured by the processes described above.

Figure 20:
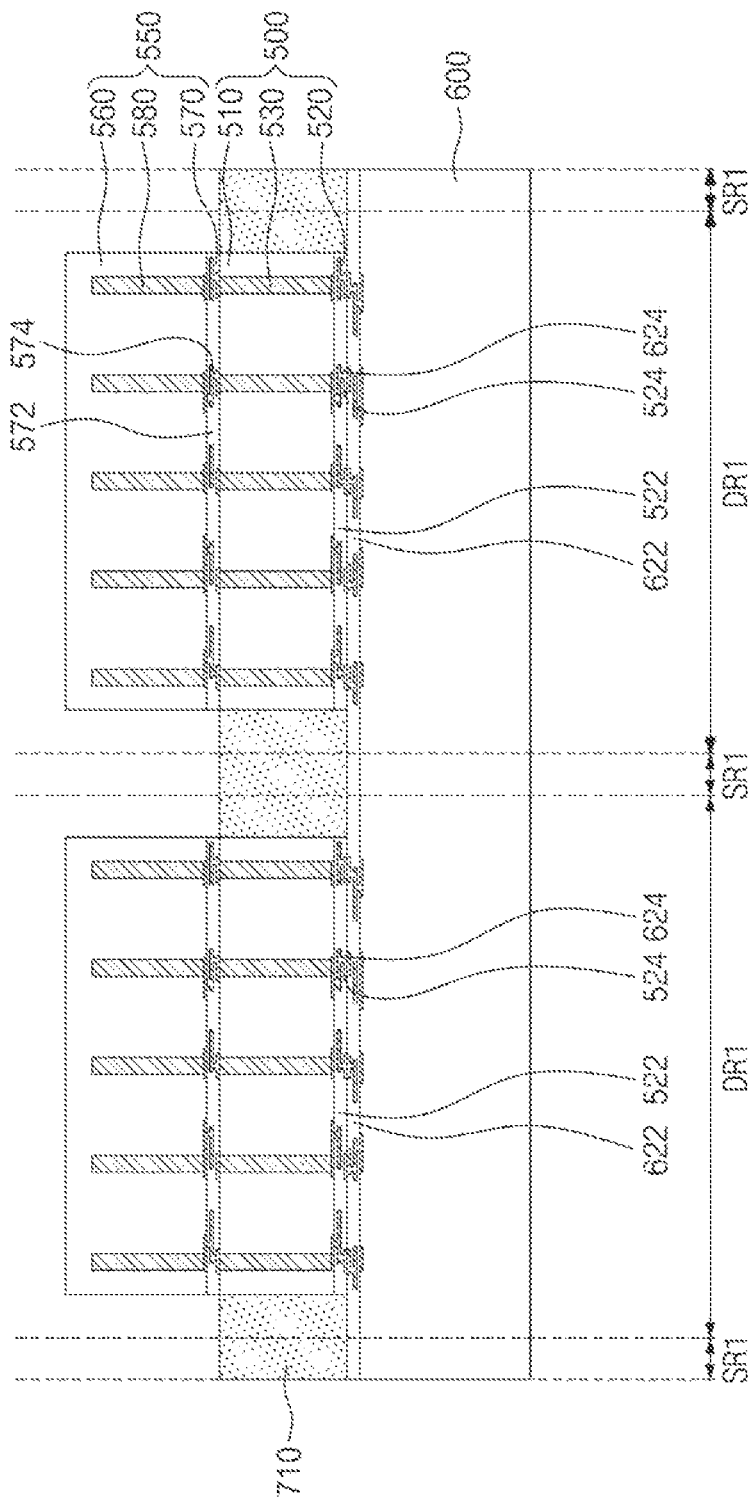
FIGS. 20 to 22 are cross-sectional views illustrating a method for manufacturing a semiconductor package according to some embodiments.
Figure 21:
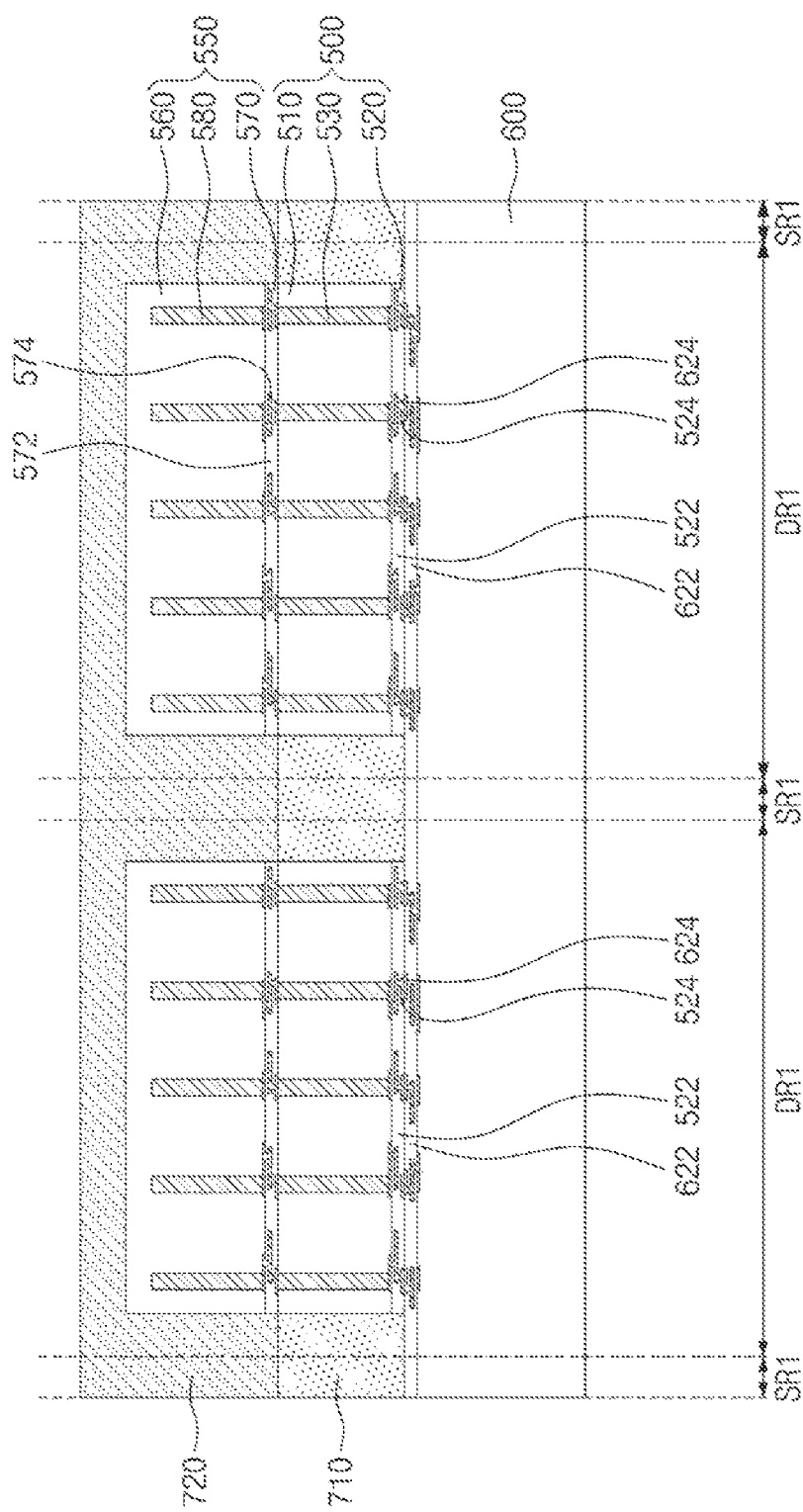
Figure 22:
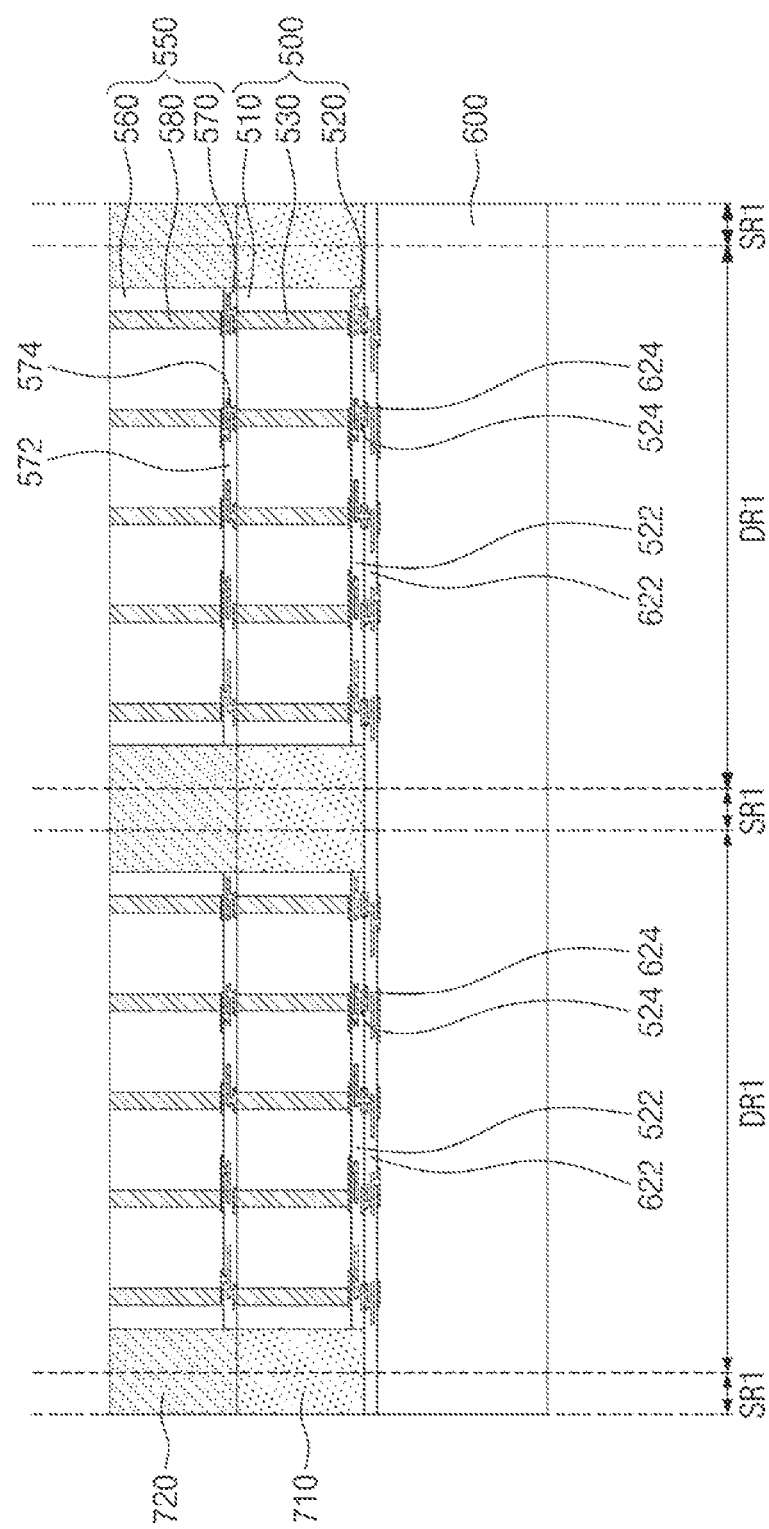

FIGS. 20 to 22 are cross-sectional views illustrating a method for manufacturing a semiconductor package according to some example embodiments.

Referring to FIG. 20, fourth semiconductor chips 550 may be provided on the resultant structure of FIG. 13. A process of forming the fourth semiconductor chips 550 may be the same as or similar to the process of forming the second semiconductor chips 500 described with reference to FIG. 10. Each of the fourth semiconductor chips 550 may include a third base layer 560, a third circuit layer 570 provided on a front surface of the third base layer 560, and at least one third via 580 penetrating the third base layer 560.

In FIG. 20, widths of the fourth semiconductor chips 550 are equal to widths of the second semiconductor chips 500. However, embodiments of the disclosure are not limited thereto. According to the example embodiments of the disclosure, the grinding or polishing process may be performed such that the top surfaces of the second semiconductor chips 500 and the top surface of the second molding layer 710 are flat, and then, the fourth semiconductor chips 550 may be mounted on the flat top surfaces. Thus, even though the widths of the fourth semiconductor chips 550 are greater or less than the widths of the second semiconductor chips 500, the fourth semiconductor chips 550 may be easily aligned.

The fourth semiconductor chips 550 may be in contact with the second semiconductor chips 500. For example, the third circuit patterns 574 of the third circuit layers 570 of the fourth semiconductor chips 550 may be in contact with the first vias 530 of the second semiconductor chips 500. The third circuit patterns 574 may be bonded to the first vias 530. For example, the third circuit patterns 574 and the first vias 530 may be formed of the same material, and the third circuit patterns 574 may be bonded to the first vias 530 by a metal-to-metal hybrid-bonding process performed by surface activation at interfaces of the third circuit patterns 574 and the first vias 530 which are in contact with each other.

Referring to FIG. 21, a fourth molding layer 720 may be formed on the second molding layer 710. For example, a molding material may be applied onto the top surface of the second molding layer 710 to cover the fourth semiconductor chips 550, and the molding material may be hardened to form the fourth molding layer 720. The fourth molding layer 720 may cover the top surface of the second molding layer 710, side surfaces of the fourth semiconductor chips 550, and back (i.e., top) surfaces of the fourth semiconductor chips 550. The molding material may include an insulating material.

Referring to FIG. 22, a portion of the fourth molding layer 720 and portions of the fourth semiconductor chips 550 may be removed. In other words, the fourth semiconductor chips 550 may be thinned in a vertical direction. For example, a grinding process or a chemical mechanical polishing (CMP) process may be performed on a top surface of the fourth molding layer 720. Thus, the back surfaces of the fourth semiconductor chips 550 and the top surface of the fourth molding layer 720 may be planarized. By the thinning process, an upper portion of the fourth molding layer 720 may be removed and upper portions of the fourth semiconductor chips 550 may also be removed. After the thinning process is performed, the back surfaces of the fourth semiconductor chips 550 may be exposed from the top surface of the fourth molding layer 720. The back surfaces of the fourth semiconductor chips 550 and the top surface of the fourth molding layer 720 may be substantially flat and may be substantially coplanar with each other.

The processes described with reference to FIGS. 16 to 18 may be performed on the resultant structure of FIG. 22. For example, the redistribution substrate 400 may be formed on the fourth semiconductor chips 550, and the second connection terminals 430 may be formed on the redistribution substrate 400. Thereafter, a singulation process may be performed to separate a plurality of second chip stacks CS2 from each other.

Referring again to FIG. 5, the first chip stack CS1 and the second chip stack CS2 may be mounted on the interposer substrate 200. The first chip stack CS1 and the second chip stack CS2 may be mounted on the interposer substrate 200 by a flip chip method. An insulating material may be applied onto the interposer substrate 200 to form a third molding layer 800. The third molding layer 800 may cover the first chip stack CS1 and the second chip stack CS2. The interposer substrate 200 may be mounted on the package substrate 100. The interposer substrate 200 may be mounted on the package substrate 100 by a flip chip method. External terminals 102 may be provided on a bottom surface of the package substrate 100.

The semiconductor package of FIG. 5 may be manufactured by the processes described above.

FIGS. 23 to 27 are cross-sectional views illustrating a method for manufacturing a semiconductor package according to some example embodiments.

Figure 23:
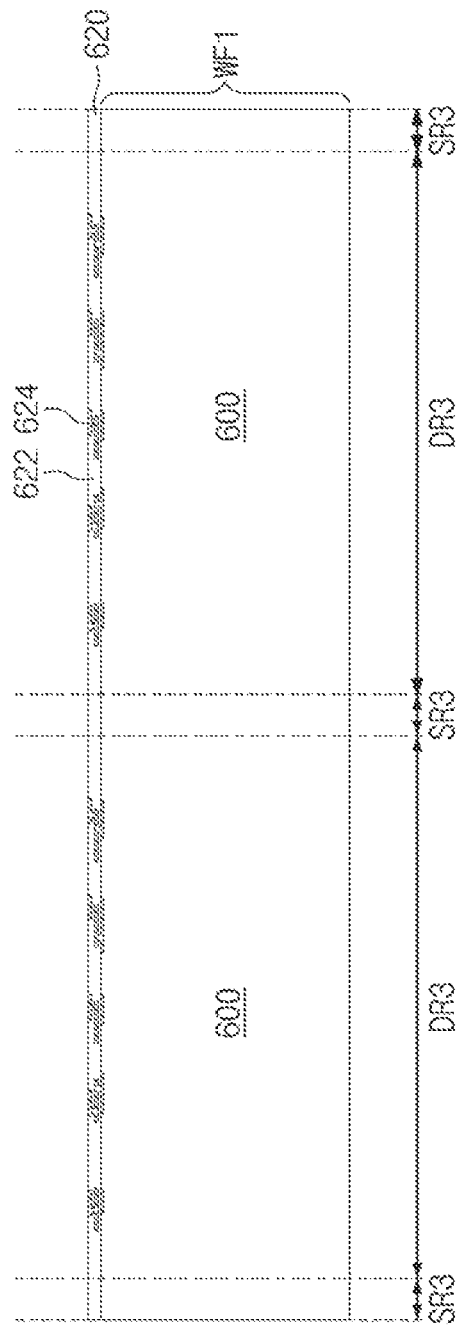
FIGS. 23 to 27 are cross-sectional views illustrating a method for manufacturing a semiconductor package according to some embodiments.

Referring to FIG. 23, a first wafer WF1 may be provided. The first wafer WF1 may be a semiconductor wafer. The first wafer WF1 may include third device regions DR3 spaced apart from each other in one direction, and a third scribe region SR3 defining the third device regions DR3.

Third semiconductor chips 600 may be formed on the third device regions DR3 of the first wafer WF1, respectively. Integrated circuits of the third semiconductor chips 600 may be formed on the top surface of the first wafer WF1. The integrated circuits of the third semiconductor chips 600 may be logic circuits.

Second circuit layers 620 of the third semiconductor chips 600 may be formed on the top surface of the first wafer WF1. For example, processes of forming and patterning an insulating layer and processes of forming and patterning a conductive layer may be repeated to form the second circuit layer 620 including a second insulating pattern 622 and a second circuit pattern 624. The second circuit pattern 624 may be electrically connected to the integrated circuit of the third semiconductor chip 600.

A singulation process may be performed on the resultant structure of FIG. 23. For example, the third scribe region SR3 of the first wafer WF1 may be sawed. Thus, a plurality of the third semiconductor chips 600 may be separated from each other.

Figure 24:
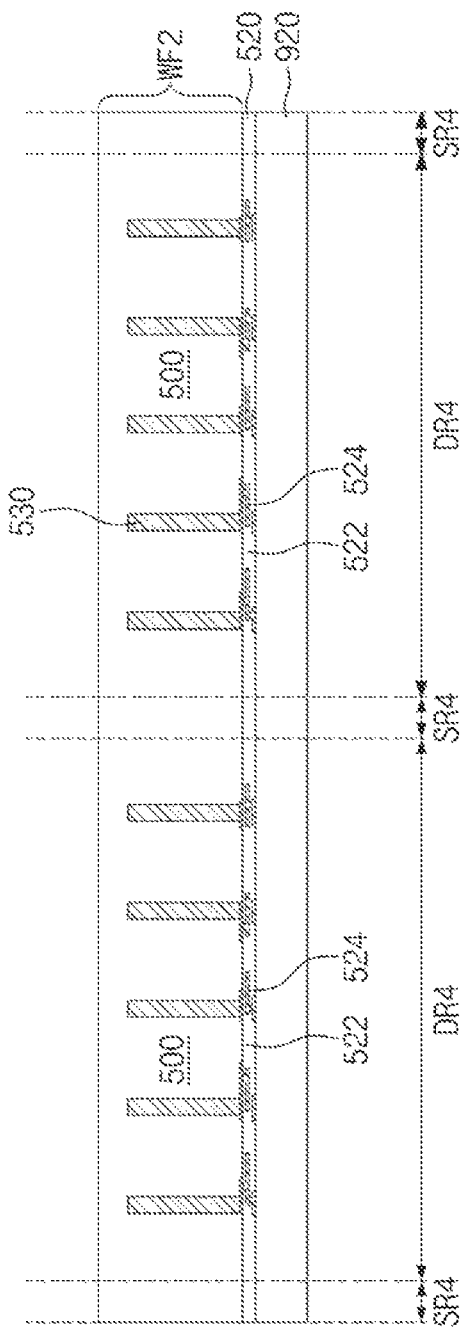

Referring to FIG. 24, a second wafer WF2 may be provided. The second wafer WF2 may be a semiconductor wafer. The second wafer WF2 may include fourth device regions DR4 spaced apart from each other in one direction, and a fourth scribe region SR4 defining the fourth device regions DR4.

Second semiconductor chips 500 may be formed on the fourth device regions DR4 of the second wafer WF2, respectively. Integrated circuits of the second semiconductor chips 500 may be formed on the top surface of the second wafer WF2. The integrated circuit of the second semiconductor chip 500 may be a memory circuit.

First vias 530 may be formed in the second wafer WF2. For example, holes may be formed in the second wafer WF2, and then, the first vias 530 may be formed by filling the holes with a conductive material. The first vias 530 may not completely penetrate the second wafer WF2 in a vertical direction. In other words, bottom surfaces of the first vias 530 may not reach a bottom surface of the second wafer WF2. In FIG. 24, the second wafer WF2 is shown in a flipped position such that the bottom surface thereof appears at a top position of the drawing.

First circuit layers 520 of the second semiconductor chips 500 may be formed on the top surface of the second wafer WF2. For example, processes of forming and patterning an insulating layer and processes of forming and patterning a conductive layer may be repeated to form the first circuit layer 520 including a first insulating pattern 522 and a first circuit pattern 524. The first circuit pattern 524 may be electrically connected to the integrated circuit of the second semiconductor chip 500.

A second carrier substrate 920 may be provided. The second carrier substrate 920 may have an adhesive member provided on a top surface of the second carrier substrate 920.

The second wafer WF2 may be adhered onto the second carrier substrate 920. For example, a surface of the first circuit layer 520 may be adhered to the adhesive member of the second carrier substrate 920.

Figure 25:
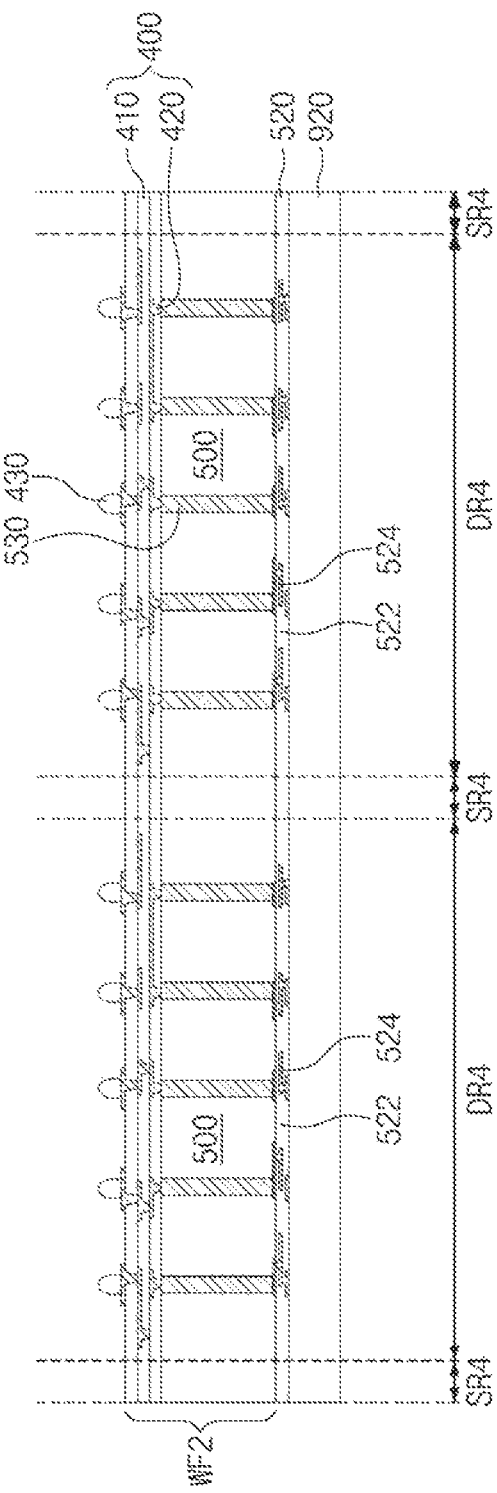

Referring to FIG. 25, a grinding or polishing process may be performed on a back (i.e., bottom) surface of the second wafer WF2 to expose the first vias 530. A redistribution substrate 400 may be formed on the second wafer WF2. For example, an insulating pattern 410 may be formed on the second wafer WF2. A conductive pattern 420 may be formed in the insulating pattern 410. One redistribution layer may be formed as described above. The process of forming the redistribution layer may be repeatedly performed to form the redistribution substrate 400. Second connection terminals 430 may be formed on the redistribution substrate 400.

Thereafter, the second carrier substrate 920 may be removed. For example, the second carrier substrate 920 may be detached by melting the adhesive member, or the second carrier substrate 920 may be physically removed.

Figure 26:
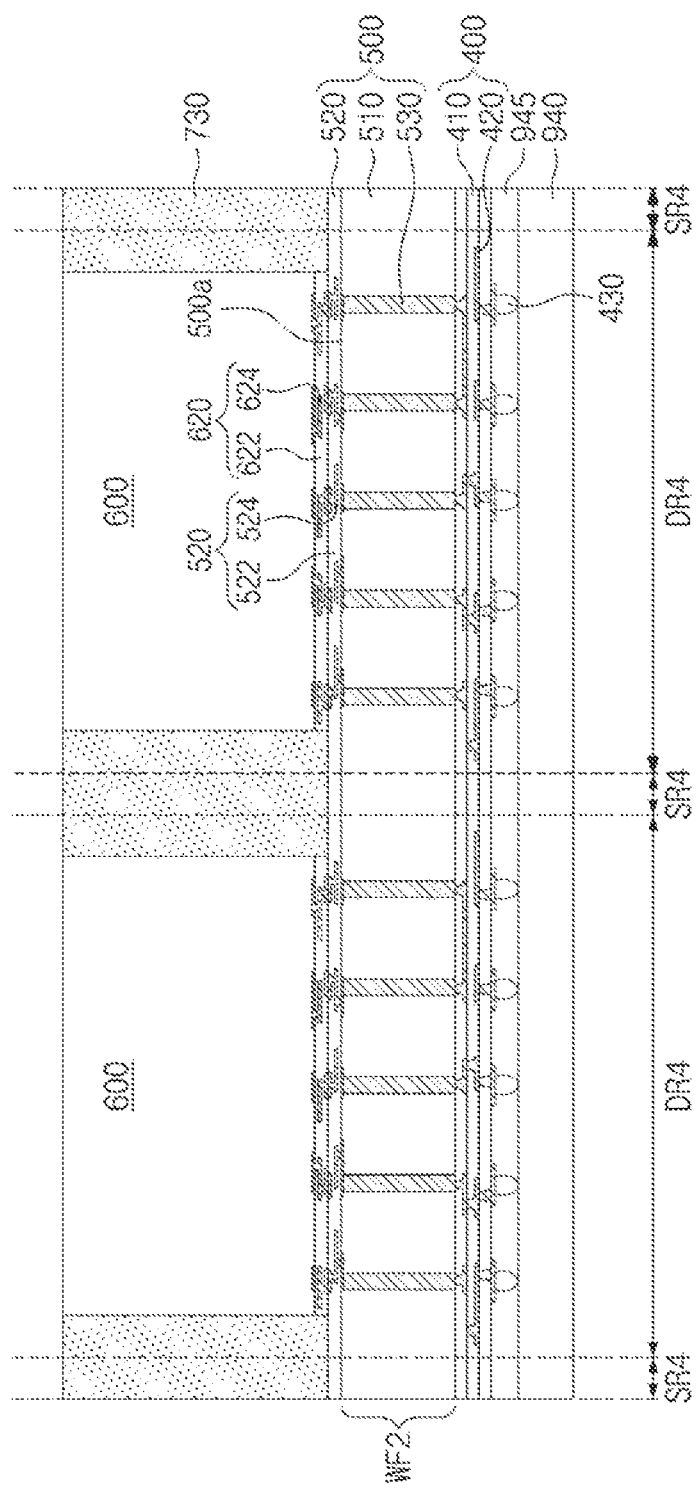

Referring to FIG. 26, a third carrier substrate 940 may be provided. An adhesive member 945 may be provided on a top surface of the third carrier substrate 940. The second wafer WF2 may be adhered onto the third carrier substrate 940. For example, a surface of the redistribution substrate 400 may be adhered to the adhesive member 945 of the third carrier substrate 940. At this time, the second connection terminals 430 may be inserted into the adhesive member 945.

The third semiconductor chips 600 may be bonded onto the second wafer WF2. The third semiconductor chips 600 may be aligned on the second semiconductor chips 500 of the second wafer WF2, respectively. The second circuit layers 620 of the third semiconductor chips 600 may face the first circuit layers 520 of the second semiconductor chips 500. The third semiconductor chips 600 may be in contact with the second semiconductor chips 500. An exposed portion of the second circuit pattern 624 of the second circuit layer 620 may be bonded to an exposed portion of the first circuit pattern 524 of the first circuit layer 520. The first circuit pattern 524 and the second circuit pattern 624 may be bonded to each other by the hybrid-bonding process performed by the surface activation at the interface of the first and second circuit patterns 524 and 624 being in contact with each other. The first circuit pattern 524 and the second circuit pattern 624 may be bonded to each other, and thus the interface between the first circuit pattern 524 and the second circuit pattern 624 may disappear.

A fifth molding layer 730 may be formed on the second wafer WF2. For example, a molding material may be applied onto the top surface of the second wafer WF2 to cover the third semiconductor chips 600, and the molding material may be hardened to form the fifth molding layer 730. The fifth molding layer 730 may at least partially cover the top surface of the second wafer WF2, side surfaces of the third semiconductor chips 600, and back surfaces of the third semiconductor chips 600. The molding material may include an insulating material.

A portion of the fifth molding layer 730 and portions of the third semiconductor chips 600 may be removed. In other words, the third semiconductor chips 600 may be thinned. For example, a grinding process or a chemical mechanical polishing (CMP) process may be performed on a top surface of the fifth molding layer 730. Thus, the back (i.e., top) surfaces of the third semiconductor chips 600 and the top surface of the fifth molding layer 730 may be planarized.

Figure 27:
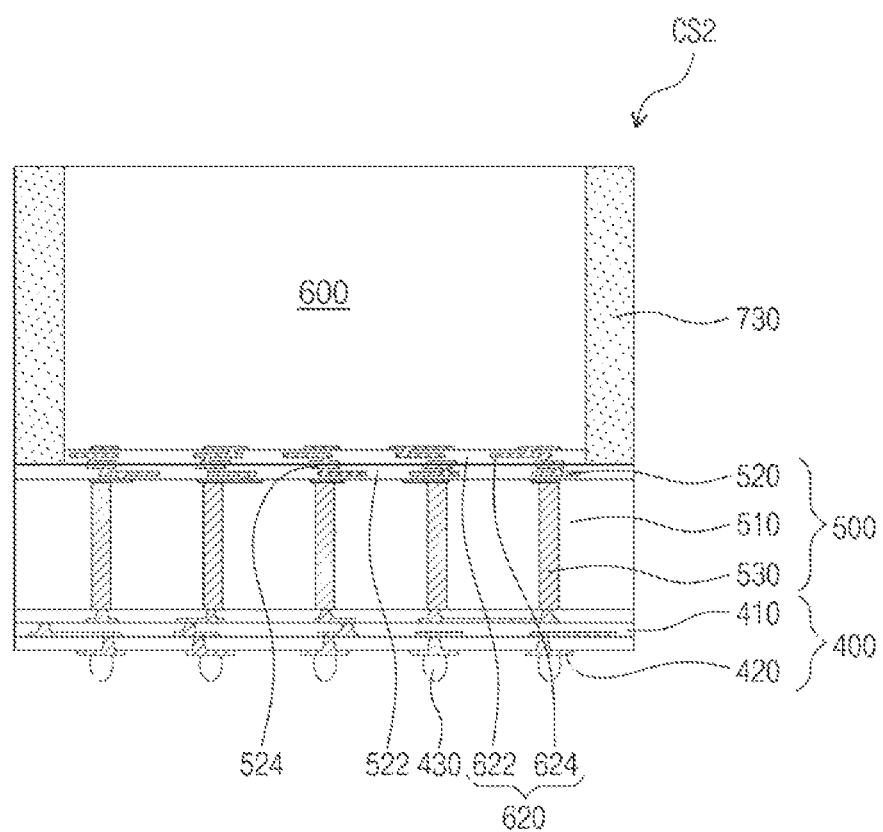

Referring to FIG. 27, a singulation process may be performed on the resultant structure of FIG. 26. For example, a sawing process may be performed along the fourth scribe region SR4 (see FIG. 26) of the second wafer WF2. The redistribution substrate 400 and the fifth molding layer 730 on the fourth scribe region SR4 and the second wafer WF2 may be sequentially sawed. Thus, a plurality of second chip stacks CS2 may be separated from each other.

Thereafter, the third carrier substrate 940 may be removed. For example, the third carrier substrate 940 may be detached by melting the adhesive member 945, or the third carrier substrate 940 may be physically removed.

Referring again to FIG. 6, the first chip stack CS1 and the second chip stack CS2 may be mounted on the interposer substrate 200. The first chip stack CS1 and the second chip stack CS2 may be mounted on the interposer substrate 200 by a flip chip method. An insulating material may be applied onto the interposer substrate 200 to form the third molding layer 800. The third molding layer 800 may cover the first chip stack CS1 and the second chip stack CS2. The interposer substrate 200 may be mounted on a package substrate 100. The interposer substrate 200 may be mounted on the package substrate 100 by a flip chip method. External terminals 102 may be provided on a bottom surface of the package substrate 100.

The semiconductor package of FIG. 6 may be manufactured by the processes described above.

In the semiconductor package according to the example embodiments of the disclosure, the first and second circuit patterns may constitute one (i.e., a single) body, and thus the second and third semiconductor chips may be firmly bonded to each other. As a result, electrical characteristics and structural stability of the semiconductor package may be improved.

In addition, since the second and third semiconductor chips are bonded directly to each other, the semiconductor package may not require an additional connection terminal between the second and third semiconductor chips and a protective material for protecting the additional connection terminal. Thus, a height of the second chip stack may be reduced to provide a small semiconductor package. Moreover, heat generated from the second and third semiconductor chips may be easily released or dissipated by way of the third semiconductor chip. Furthermore, the second molding layer may expose the side surface of the third semiconductor chip. Thus, heat generated from the third semiconductor chip which may generate a lot of heat may be easily released or dissipated.

While example embodiments have been described, it will be apparent to those skilled in the art that various changes and modifications may be made without departing from the spirit and scope of the disclosure. Therefore, it should be understood that the above example embodiments are not limiting, but illustrative. Thus, the scope of the disclosure is to be determined by the broadest permissible interpretation of the following claims and their equivalents, and shall not be restricted or limited by the foregoing description.

What is claimed is:

1. A method of fabricating a semiconductor package, the method comprising:
   forming logic chips on a first wafer, each of the logic chips comprising a first circuit layer provided on a top surface of the first wafer;
   forming first memory chips on a second wafer, each of the first memory chips comprising a second circuit layer provided on a top surface of the second wafer, and a first via penetrating the second wafer and connected to the second circuit layer;
   performing a first singulation process on the second wafer to separate the first memory chips each other;
   bonding the first memory chips onto the first wafer;
   forming, on the first wafer, a first molding layer which surrounds the first memory chips;
   forming a redistribution substrate on the first molding layer and the first memory chips; and
   performing a second singulation process on the first molding layer and the first wafer to separate the logic chips each other, wherein, during the second singulation process, the first memory chips are spaced apart from a sawing line for the second singulation process.

2. The method as claimed in claim 1, wherein the bonding the first memory chips onto the first wafer comprising:
aligning the first memory chips on the logic chips of the first wafer;
disposing the first memory chips on the first wafer to contact the first circuit layer and the second circuit layer each other; and
performing a hybrid-bonding process to directly bond a circuit pattern of the first circuit layer and a circuit pattern of the second circuit layer.

3. The method as claimed in claim 1, wherein, after the second singulation process, an outer vertical side surface of the first molding layer is coplanar with a vertical side surface of the logic chips.

4. The method of claim 1, wherein, after the second singulation process, each of the first memory chips vertically overlaps one of the logic chips, and
wherein a width of the logic chips is greater than a width of the first memory chips.

5. The method as claimed in claim 1, wherein the forming the first molding layer comprises:
forming the first molding layer on the first wafer to cover the first memory chips; and
performing a thinning process on the first molding layer and the first memory chips to remove a portion of the first molding layer and portions of the first memory chips, and
wherein, after the thinning process, the first via of the first memory chips is exposed at back surfaces of the first memory chips.

6. The method of claim 1, before the forming the redistribution substrate, further comprising:
forming second memory chips on a third wafer, each of the second memory chips comprising a third circuit layer provided on a top surface of the third wafer, and a second via penetrating the third wafer and connected to the third circuit layer;
performing a third singulation process on the third wafer to separate the second memory chips each other;
bonding the second memory chips onto the first memory chips; and
forming, on the first molding layer, a second molding layer which surrounds the second memory chips,
wherein the redistribution substrate is formed on the second molding layer and the second memory chips.

7. The method as claimed in claim 6, wherein the bonding the second memory chips onto the first memory chips comprises:
aligning the second memory chips on the first memory chips;
disposing the second memory chips on the first memory chips to contact a back side of the first memory chips and the third circuit layer each other; and
performing a hybrid-bonding process to directly bond the first via and a circuit pattern of the third circuit layer.

8. The method as claimed in claim 6, wherein an interface of the second molding layer and the first molding layer is located in a same plane as an interface of the second memory chips and the first memory chips.

9. The method as claimed in claim 1, wherein, during the second singulation process, the redistribution substrate is cut together into portions of the redistribution substrate, and wherein, after the second singulation process, a width of the logic chips is equal to a width of the portions of the redistribution substrate.

10. The method as claimed in claim 9, wherein the logic chips are vertically aligned with the portions of the redistribution substrate, and
wherein the first molding layer is provided between the logic chips and the portions of the redistribution substrate.

11. A method of fabricating a semiconductor package, the method comprising:
forming logic chips on a first wafer, each of the logic chips comprising a first circuit layer provided on a top surface of the first wafer;
performing a first singulation process on the first wafer to separate the logic chips each other;
forming first memory chips on a front surface of a second wafer, each of the first memory chips comprising a second circuit layer provided on the front surface of the second wafer, and a first via penetrating the second wafer and connected to the second circuit layer;
forming a redistribution substrate on a back surface of the second wafer;
bonding the logic chips onto the front surface of the second wafer;
forming, on the front surface of the second wafer, a molding layer which surrounds the logic chips; and
performing a second singulation process on the molding layer and the second wafer to separate the first memory chips each other,
wherein, during the second singulation process, the logic chips are spaced apart from a sawing line for the second singulation process.

12. The method as claimed in claim 11, wherein the bonding the logic chips onto the second wafer comprising:
aligning the logic chips on the first memory chips of the second wafer;
disposing the logic chips on the second wafer to contact the first circuit layer and the second circuit layer each other; and
performing a hybrid-bonding process to directly bond a circuit pattern of the first circuit layer and a circuit pattern of the second circuit layer.

13. The method as claimed in claim 11, wherein, after the second singulation process, an outer vertical side surface of the molding layer is coplanar with a vertical side surface of the first memory chips.

14. The method of claim 11, wherein, after the second singulation process, each of the logic chips vertically overlaps one of the first memory chips, and
wherein a width of the first memory chips is greater than a width of the logic chips.

15. The method as claimed in claim 11, wherein the forming the molding layer comprising:
forming the molding layer on the second wafer to cover the logic chips; and
performing a thinning process on the molding layer and the logic chips to remove a portion of the molding layer and portions of the logic chips.

16. The method of claim 11, further comprising, before the bonding the logic chips onto the second wafer:
forming second memory chips on a third wafer, each of the second memory chips comprising a third circuit layer provided on a top surface of the third wafer, and a second via penetrating the third wafer and connected to the third circuit layer; and
bonding the third wafer onto the second wafer, wherein the logic chips are bonded onto the third wafer, and the molding layer is formed on the third wafer.

17. The method as claimed in claim 16, wherein, during the second singulation process, the third wafer is cut together to separate the second memory chips each other, and wherein a width of the first memory chips is equal to a width of the second memory chips.

18. The method as claimed in claim 11, wherein, during the second singulation process, the redistribution substrate is cut together into portions of the redistribution substrate, and wherein, after the second singulation process, a width of the first memory chips is equal to a width of the portions of the redistribution substrate.

19. The method as claimed in claim 11, wherein the redistribution substrate comprises:

an insulating layer;

an interconnection pattern horizontally extending in the insulating layer; and a via pattern vertically penetrating the insulating layer and connected to the interconnection pattern, and wherein the first via is connected to the via pattern of the redistribution substrate.

20. The method as claimed in claim 11, wherein an active surface of the first memory chips and an active surface of the logic chips contact each other.

* * * * *